United States Patent
Ohnuki

(10) Patent No.: US 8,736,371 B2
(45) Date of Patent: May 27, 2014

(54) SEMICONDUCTOR DEVICE HAVING TRANSISTORS EACH OF WHICH INCLUDES AN OXIDE SEMICONDUCTOR

(75) Inventor: Tatsuya Ohnuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 70 days.

(21) Appl. No.: 13/468,117

(22) Filed: May 10, 2012

(65) Prior Publication Data

US 2012/0286871 A1 Nov. 15, 2012

(30) Foreign Application Priority Data

May 13, 2011 (JP) ................... 2011-108736

(51) Int. Cl.
*H03F 3/45* (2006.01)
*H03F 3/26* (2006.01)

(52) U.S. Cl.
USPC .......................................... 330/255

(58) Field of Classification Search
USPC ......................... 330/255, 264, 267
See application file for complete search history.

(56) References Cited

U.S. PATENT DOCUMENTS

| | | | |
|---|---|---|---|
| 5,528,032 A | 6/1996 | Uchiyama | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,885,240 B2 * | 4/2005 | Cha ................................. | 330/51 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |

(Continued)

FOREIGN PATENT DOCUMENTS

| | | |
|---|---|---|
| CN | 1629760 A | 6/2005 |
| EP | 1 737 044 A1 | 12/2006 |

(Continued)

OTHER PUBLICATIONS

International Search Report, PCT Application No. PCT/JP2012/061701, dated Aug. 14, 2012, 3 pages.

(Continued)

*Primary Examiner* — Steven J Mottola
(74) *Attorney, Agent, or Firm* — Fish & Richardson P.C.

(57) ABSTRACT

To provide a semiconductor device with low power consumption, in a semiconductor device including a differential amplifier to which an input potential and a reference potential are input, a gain stage, and an output stage from which an output potential is output, a potential supplied from the gain stage can be held constant by providing the output stage with a transistor with low leakage current in an off state. As the transistor with low leakage current in an off state, a transistor including an oxide semiconductor layer and a channel formation region included in the oxide semiconductor layer is used.

19 Claims, 24 Drawing Sheets

(56) References Cited

U.S. PATENT DOCUMENTS

| | | |
|---|---|---|
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0134537 A1 | 6/2005 | Tobita |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0216048 A1* | 9/2011 | Koyama et al. ............ 345/204 |

FOREIGN PATENT DOCUMENTS

| | | |
|---|---|---|
| EP | 1 770 788 A2 | 4/2007 |
| EP | 1 995 787 A2 | 11/2008 |
| EP | 1 998 373 A2 | 12/2008 |
| EP | 1 998 374 A2 | 12/2008 |
| EP | 1 998 375 A2 | 12/2008 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-010711 A | 1/1989 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-182494 A | 7/2005 |
| JP | 2007-096055 A | 4/2007 |
| JP | 2007-096594 A | 4/2007 |
| JP | 2007-123861 A | 5/2007 |
| JP | 2008-053554 A | 3/2008 |
| KR | 2005-0062379 A | 6/2005 |
| WO | 2004/114391 A1 | 12/2004 |

OTHER PUBLICATIONS

Written Opinion, PCT Application No. PCT/JP2012/061701, dated Aug. 14, 2012, 4 pages.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5 pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

(56) References Cited

OTHER PUBLICATIONS

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-effect Transistor on $SrTiO_3$ with Sputtered $Al_2O_3$ Gate Insulator, ", Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543 .

Fung, T et al., "2-D Numerical Simulation of High Performance Amorphous In—Ga—Zn—O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing $MOO_3$ as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,$YbFe_2O_4$, and $Yb_2Fe_3O_7$ Types of Structures for Compounds in the $In_2O_3$ and $Sc_2O_3$—$A_2O_3$—BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N. et al., "Syntheses and Single-Crystal Data of Homologous Compounds, $In_2O_3(ZnO)m$ (m = 3, 4, and 5), $InGaO_3(ZnO)3$,

(56) References Cited

OTHER PUBLICATIONS and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compund with New Long-Period Structure,", NRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTS With a Novel Passivation Layer," SID Digest '09 : SID International Symposium Digest of Technical Papers, May 31, 2009, pp. 284-287.

* cited by examiner

● In
☾ Sn
c Zn
● O

US 8,736,371 B2

SEMICONDUCTOR DEVICE HAVING TRANSISTORS EACH OF WHICH INCLUDES AN OXIDE SEMICONDUCTOR

TECHNICAL FIELD

The present invention relates to a semiconductor device. Note that in this specification, a semiconductor device refers to a semiconductor element or any device including a semiconductor element. As such a semiconductor element, a gate-insulated field-effect transistor can be given, for example. The semiconductor device also includes a semiconductor circuit including a semiconductor element, an electro-optical device such as a display device, and an electronic device.

BACKGROUND ART

A voltage follower is a semiconductor device which outputs a potential that is equivalent to an input potential. In a semiconductor integrated circuit which is an example of a semiconductor device, the voltage follower can be used as a buffer of a potential generating circuit.

In addition, with the use of two voltage followers, an input potential signal can be held (Patent Document 1).

Meanwhile, in recent years, metal oxides having semiconductor characteristics (hereinafter referred to as oxide semiconductors) have attracted attention. Oxide semiconductors may be applied to transistors (see Patent Documents 2 and 3).

REFERENCE

[Patent Document 1] Japanese Published Patent Application No. 2007-096594
[Patent Document 2] Japanese Published Patent Application No. 2007-123861
[Patent Document 3] Japanese Published Patent Application No. 2007-096055

DISCLOSURE OF INVENTION

In the case where a voltage follower is used as a buffer of a potential generating circuit, the potential generating circuit is driven constantly. In other words, this means constant input of a potential signal from the potential generating circuit, which increases the power consumption of a semiconductor device.

Thus, in view of the above, it is an object of one embodiment of the present invention to provide a semiconductor device with low power consumption.

According to one embodiment of the present invention, in a semiconductor device including a differential amplifier to which an input potential (hereinafter also referred to as $V_{\_in}$) and a reference potential (hereinafter also referred to as $V_{\_bias}$) are bias, input and a gain stage which outputs an output potential (hereinafter also referred to as $V_{\_out}$), a gate potential of a transistor which is electrically connected to an output terminal from which the output potential $V_{\_out}$ is output can be held constant by providing the gain stage with a transistor with low leakage current in an off state.

According to another embodiment of the present invention, in a semiconductor device including a differential amplifier to which an input potential $V_{\_in}$ and a reference potential $V_{\_bias}$ are input, an output stage which outputs an output potential $V_{\_out}$ which is equivalent to the input potential $V_{\_in}$, and a gain stage which is provided between the differential amplifier and the output stage and is electrically connected to the differential amplifier and the output stage, a gate potential of a transistor which is electrically connected to an output terminal from which the output potential $V_{\_out}$ is output can be held constant by providing the output stage with the transistor with low leakage current in an off state.

As the transistor with low leakage current in an off state, a transistor including an oxide semiconductor layer and a channel formation region included in the oxide semiconductor layer is used, for example.

In this specification, a leakage current in an off state refers to a current that flows between a source and drain when a voltage applied to a gate (also referred to as $V_{gs}$ or simply $V_g$) is lower than a threshold voltage of the transistor on the basis of the source of the transistor. Therefore, "a transistor is turned off" means to set a voltage $V_{gs}$ to a value lower than or equal to a threshold voltage of the transistor. In addition, the leakage current in an off state can be simply referred to as off-state current.

In this specification, the expression "power supply is turned off" means to set a state where there is no potential difference between a high-potential-side power supply potential line (hereinafter also referred to as $V_{dd}$) and a low-potential-side power supply potential line (hereinafter also referred to as $V_{ss}$). Further, the expression "power supply is turned on" means to set a state where there is a potential difference between the high-potential-side power supply potential line and the low-potential-side power supply potential line.

According to one embodiment of the present invention, a potential supplied from a differential amplifier of a semiconductor device is held after a transistor with low leakage current in an off state is turned off; therefore, without supply of an input potential, a potential which is equivalent to the input potential can be output. Thus, a peripheral circuit such as a circuit which generates the input potential can be stopped and a semiconductor device with lower power consumption can be provided.

Further, according to one embodiment of the present invention, a reference potential is held after the transistor with low leakage current in an off state is turned off; therefore, without supply of a reference potential, the semiconductor device can be operated. Thus, a peripheral circuit such as a circuit which generates the reference potential can be stopped and a semiconductor device with lower power consumption can be provided.

BEST MODE FOR CARRYING OUT THE INVENTION

Figure 1:
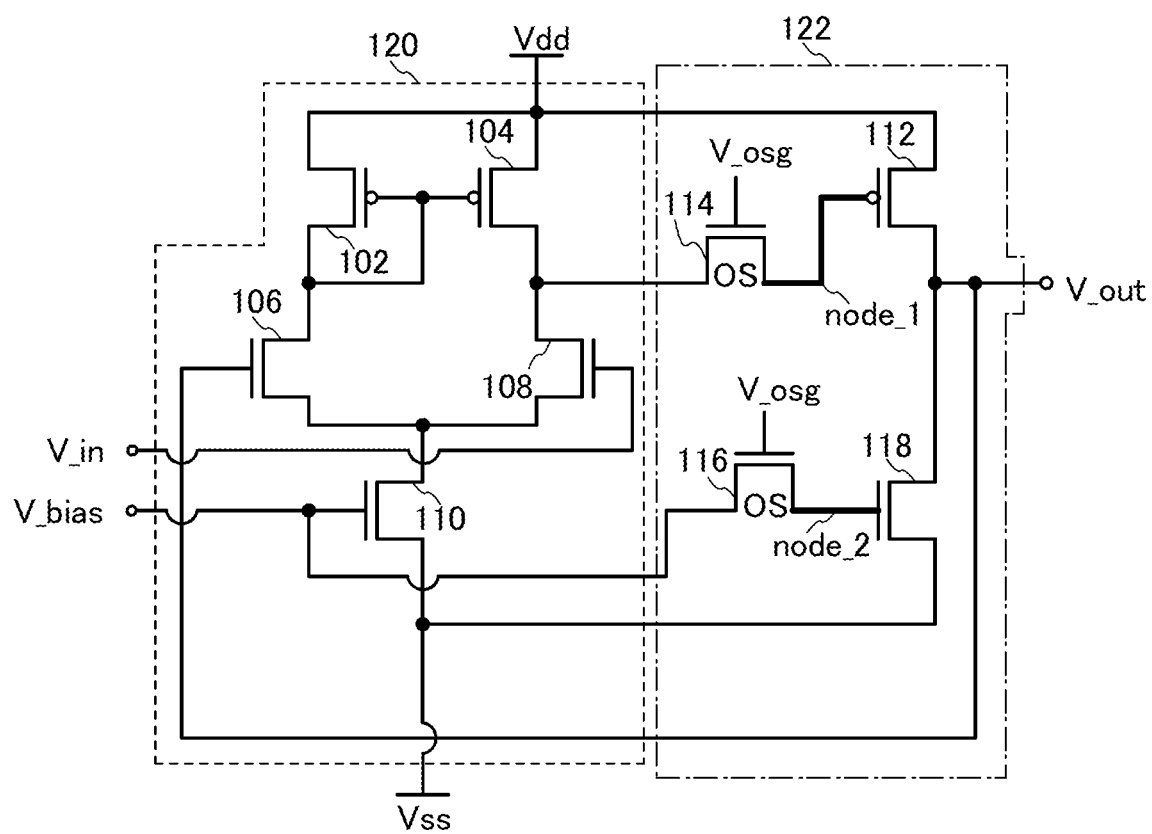
FIG. 1 is a circuit diagram illustrating an example of a voltage follower according to one embodiment of the present invention.

Embodiments of the present invention will be described in detail with reference to the accompanying drawings. However, the present invention is not limited to the description below, and those skilled in the art will appreciate that a variety of modifications can be made to the modes and details without departing from the spirit and scope of the present invention. Therefore, the present invention should not be construed as being limited to the description in the following embodiments. Note that the same portions or portions having the same function in the structure of the present invention described below are denoted by the same reference numerals in common among different drawings and repetitive description thereof will be omitted.

Note that in each drawing described in this specification, the size, the film thickness, or the region of each component is exaggerated for clarity in some cases. Therefore, the scale is not necessarily limited to that illustrated in the drawings and the like.

Note that in this specification, the terms "first", "second", and "third" are used in order to avoid confusion between components and thus do not limit the number of the components. Therefore, for example, the term "first" can be replaced with the term "second", "third", or the like as appropriate.

In this specification, the expression "A is electrically connected to B" or "A and B are electrically connected" includes a case where A and B are directly connected to one another and a case where A and B are connected to one another with an object interposed therebetween.

In this specification, a "source" includes a source electrode, a region or an object electrically connected to the source electrode (e.g., a source region or a source terminal), and the like. Further, a "drain" includes a drain electrode, a region or an object electrically connected to the drain electrode (e.g., a drain region or a drain terminal), and the like. Since a source and a drain of a transistor change depending on the polarity, the operating condition, and the like of the transistor, it is difficult to define which is a source or a drain. Therefore, one of a source terminal and a drain terminal is referred to as first terminal and the other thereof is referred to as second terminal for distinction. Note that a "gate" includes a gate electrode, a region or an object electrically connected to the gate electrode (e.g., a gate terminal), and the like.

Embodiment 1

Figure 23A:
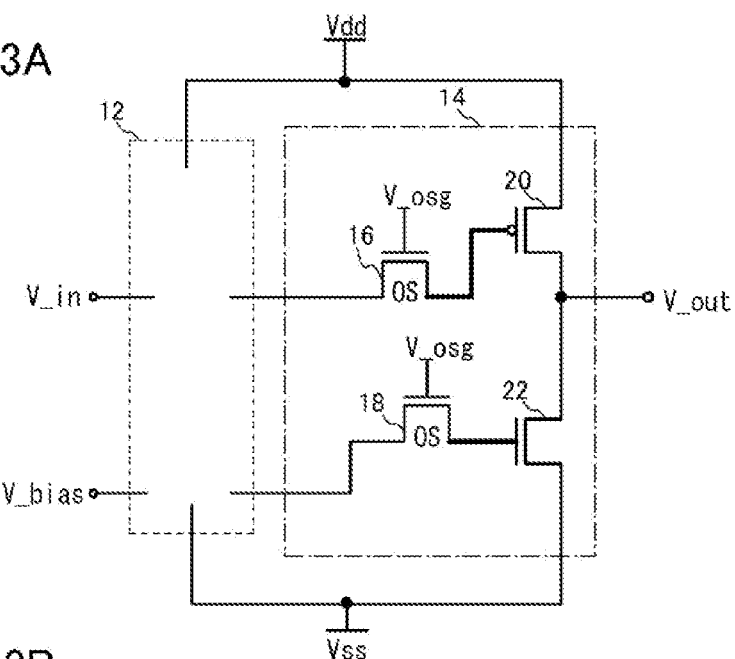
FIGS. 23A and 23B each illustrate a conceptual diagram of a semiconductor device according to one embodiment of the present invention.
Figure 23B:
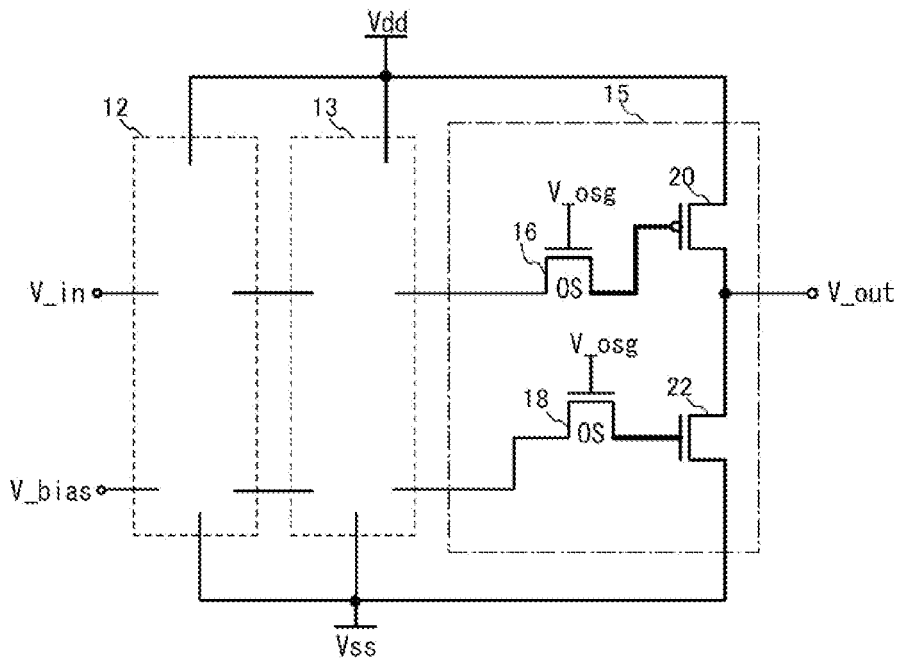

In this embodiment, a semiconductor device according to one embodiment of the present invention will be described. FIGS. 23A and 23B are schematic diagrams illustrating a semiconductor device according to one embodiment of the present invention.

A semiconductor device illustrated in FIG. 23A includes a differential amplifier 12 in which a first input terminal to which an input potential $V_{\_in}$ is input and a second input terminal to which a reference potential $V_{\_bias}$ is input are electrically connected to each other and a gain stage 14 which includes at least a first transistor 16, a second transistor 18, a third transistor 20, and a fourth transistor 22 and is electrically connected to an output terminal from which an output potential $V_{\_out}$ is output. The differential amplifier 12 is electrically connected to power supply potential lines $V_{dd}$ and $V_{ss}$. A first terminal of the first transistor 16 is electrically connected to the first input terminal through the differential amplifier 12, and a second terminal of the first transistor 16 is electrically connected to a gate of the third transistor 20. A first terminal of the second transistor 18 is electrically connected to the second input terminal through the differential amplifier 12. A second terminal of the second transistor 18 is electrically connected to a gate of the fourth transistor 22. A first terminal of the third transistor 20 is electrically connected to the power supply potential line $V_{dd}$. A second terminal of the third transistor 20 and a first terminal of the fourth transistor 22 are electrically connected to the output terminal A second terminal of the fourth transistor 22 is electrically connected to the power supply potential line $V_{ss}$. The first transistor 16 and the second transistor 18 are each a transistor whose leakage current in an off state per micrometer of a channel width is lower than or equal to $1 \times 10^{-17}$ A.

In addition, in the semiconductor device in FIG. 23A, the third transistor 20 is a p-channel transistor and the fourth transistor 22 is an n-channel transistor; however, the conductivity types of the transistors can be changed as appropriate depending on the circuit configuration of the differential amplifier 12.

A semiconductor device illustrated in FIG. 23B includes the differential amplifier 12 in which the first input terminal to which an input potential $V_{\_in}$ is input and the second input terminal to which a reference potential $V_{\_bias}$ is input are electrically connected to each other; an output stage 15 which includes at least the first transistor 16, the second transistor 18, the third transistor 20, and the fourth transistor 22 and is electrically connected to the output terminal from which an output potential $V_{\_out}$ is output; and a gain stage 13 which is provided between the differential amplifier 12 and the output stage 15 and is electrically connected to the differential amplifier 12 and the output stage 15. The differential amplifier 12 and the gain stage 13 are electrically connected to power supply potential lines $V_{dd}$ and $V_{ss}$. The first terminal of the first transistor 16 is electrically connected to the first input terminal through the differential amplifier 12 and the gain stage 13, and the second terminal of the first transistor 16 is electrically connected to the gate of the third transistor 20. The first terminal of the second transistor 18 is electrically connected to the second input terminal through the differential amplifier 12 and the gain stage 13. The second terminal of the second transistor 18 is electrically connected to the gate of the fourth transistor 22. The first terminal of the third transistor 20 is electrically connected to the power supply potential line $V_{dd}$. The second terminal of the third transistor 20 and the first terminal of the fourth transistor 22 are electrically connected to the output terminal. The second terminal of the fourth transistor 22 is electrically connected to the power supply potential line $V_{ss}$. The first transistor 16 and the second transistor 18 are each a transistor whose leakage current in an off state per micrometer of a channel width is lower than or equal to $1 \times 10^{-17}$ A.

In addition, in the semiconductor device in FIG. 23B, the third transistor 20 is a p-channel transistor and the fourth transistor 22 is an n-channel transistor; however, the conductivity types of the transistors can be changed as appropriate depending on the circuit configurations of the differential amplifier 12 and the gain stage 13.

In each of the semiconductor devices in FIGS. 23A and 23B, in a state where gate potentials of the first transistor 16 and the second transistor 18 are set to potentials for turning on the first transistor 16 and the second transistor 18 (hereinafter in also referred to as a potential $V_{\_osg}$), gate potentials of the third transistor 20 and the fourth transistor 22 can be held constant in a manner such that the first transistor 16 and the second transistor 18 are turned off after the input potential $V_{\_in}$ and a reference potential $V_{\_bias}$ are input. This is because, since the leakage current in an off state of the first transistor 16 and the second transistor 18 is low, nodes indicated by heavy lines in FIGS. 23A and 23B can be brought into a floating state.

Next, a voltage follower will be described as an example of a semiconductor device according to one embodiment of the present invention.

FIG. 1 illustrates an example of a voltage follower according to one embodiment of the present invention. A voltage follower 100 in FIG. 1 includes first to ninth transistors. The connection relations of the first to ninth transistors are described below.

A first terminal of a first transistor 102 and a first terminal of a second transistor 104 are electrically connected to a power supply potential line $V_{dd}$; a second terminal of the first transistor 102 is electrically connected to a gate of the first transistor 102, a gate of the second transistor 104, and a first terminal of a third transistor 106; a second terminal of the second transistor 104 is electrically connected to a first terminal of a fourth transistor 108; a second terminal of the third transistor 106 and a second terminal of the fourth transistor 108 are electrically connected to a first terminal of a fifth transistor 110; and a second terminal of the fifth transistor 110 is electrically connected to a power supply potential line $V_{ss}$.

A first terminal of a sixth transistor 112 is electrically connected to the power supply potential line $V_{dd}$; a first terminal of a seventh transistor 114 is electrically connected to the second terminal of the second transistor 104 and the first terminal of the fourth transistor 108; a second terminal of the seventh transistor 114 is electrically connected to a gate of the sixth transistor 112; a first terminal of an eighth transistor 116 is electrically connected to a gate of the fifth transistor 110; a second terminal of the eighth transistor 116 is electrically connected to a gate of a ninth transistor 118; and a first terminal of the ninth transistor 118 is electrically connected to the second terminal of the fifth transistor 110 and the power supply potential line $V_{ss}$.

A gate of the fourth transistor 108 is electrically connected to a first input terminal to which an input potential $V_{\_in}$ is input, a second of the sixth transistor 112 and a second terminal of the ninth transistor 118 are electrically connected to an output terminal from which an output potential $V_{\_out}$ is output, and the gate of the fifth transistor 110 is electrically connected to a second input terminal to which a reference potential $V_{\_bias}$ is input.

The first transistor 102, the second transistor 104, and the sixth transistor 112 are p-channel transistors; the third transistor 106, the fourth transistor 108, the fifth transistor 110, and the ninth transistor 118 are n-channel transistors.

The seventh transistor 114 and the eighth transistor 116 are each a transistor whose leakage current in an off state (off-state current) per micrometer of a channel width is lower than or equal to $1 \times 10^{-17}$ A. The off-state current is preferably lower than or equal to $1 \times 10^{-18}$ A, more preferably lower than or equal to $1 \times 10^{-21}$ A, further preferably $1 \times 10^{-24}$ A.

In the drawings, the high-potential side power supply potential line is denoted by $V_{dd}$ and the low-potential side power supply potential line is denoted by $V_{ss}$ (this also applies to the description below).

In the voltage follower 100, a circuit group including the first transistor 102, the second transistor 104, the third transistor 106, the fourth transistor 108, and the fifth transistor 110 is to be referred to as differential amplifier 120.

In the voltage follower 100, a circuit group including the sixth transistor 112, the seventh transistor 114, the eighth transistor 116, and the ninth transistor 118 is to be referred to as gain stage 122. Note that in the voltage follower 100, the gain stage 122 also functions as an output stage.

Figure 2:
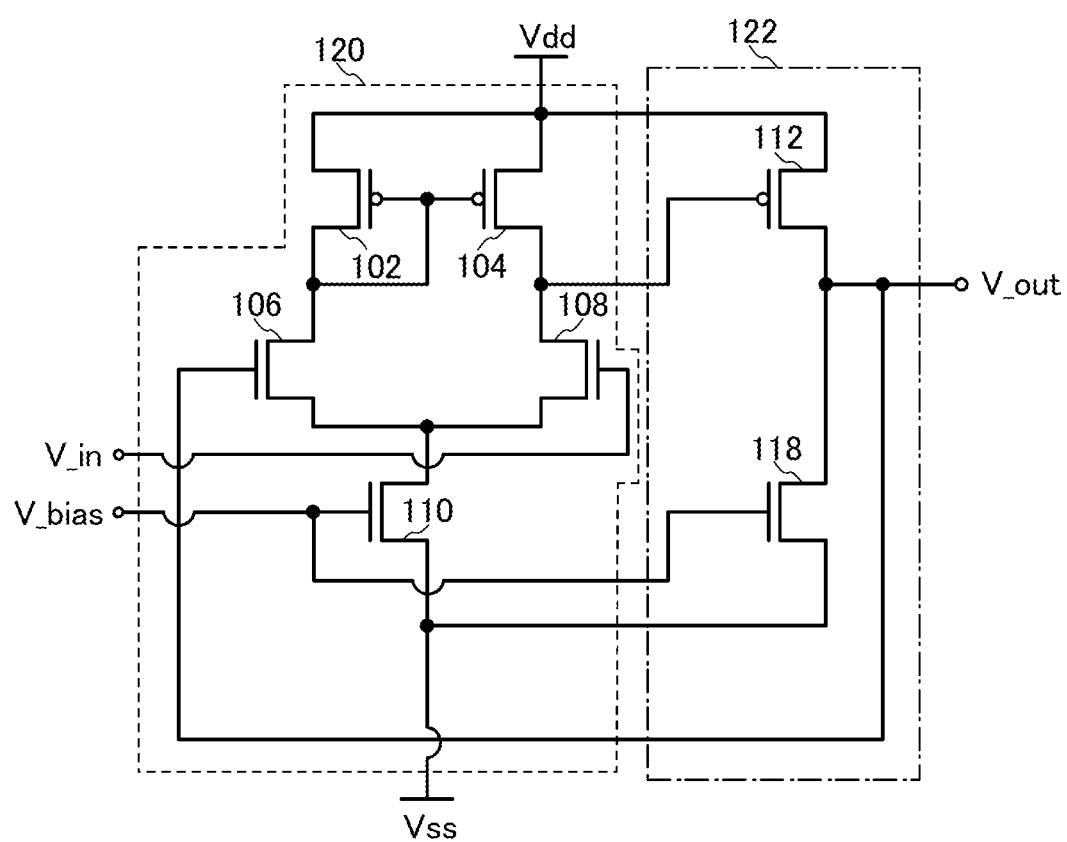
FIG. 2 is a circuit diagram illustrating an example of a conventional voltage follower.

Here, operation of a conventional voltage follower is briefly described. FIG. 2 illustrates an example of the conventional voltage follower to describe the operation. Transistors which form the conventional voltage follower in FIG. 2 and connection relations thereof correspond to those of the voltage follower 100 from which the seventh transistor 114 and the eighth transistor 116 are omitted. Note that the operation of the conventional voltage follower is described using the reference numerals of the voltage follower 100.

First, from the conventional voltage follower in which the power supply is on and a reference potential $V_{\_bias}$ and an input potential $V_{\_in}$ are sufficiently supplied, an output potential $V_{\_out}$ which is equivalent to the input potential $V_{\_in}$ is output by potentials supplied to the gates of the sixth transistor 112 and the ninth transistor 118 which form the gain stage 122. Note that a state in which the input potential $V_{\_in}$ is sufficiently supplied refers to a state in which current flows constantly between the first terminal and the second terminal of the fourth transistor 108 by an input potential $V_{\_in}$. A state in which the reference potential $V_{\_bias}$ is sufficiently supplied refers to a state in which current flows constantly between the first terminal and the second terminal of the fifth transistor 110 and between the first terminal and the second terminal of the ninth transistor 118.

In other words, from the conventional voltage follower in which the power supply is on and a reference potential $V_{\_bias}$ and an input potential $V_{\_in}$ are sufficiently supplied, the output potential $V_{\_out}$ which is equivalent to the input potential $V_{\_in}$ is output by a potential supplied from the differential amplifier 120.

Thus, in the conventional voltage follower, the input potential $V_{\_in}$ and the reference potential $V_{\_bias}$ are constantly supplied to obtain the output potential $V_{\_out}$.

Next, operation of the voltage follower 100 according to one embodiment of the present invention is described. From the voltage follower 100 in which potentials $V_{\_osg}$ for turning on the seventh transistor 114 and the eighth transistor 116 are sufficiently supplied to gates of the seventh transistor 114 and the eighth transistor 116, the output potential $V_{\_out}$ which is equivalent to the input potential $V_{\_in}$ is output by the potentials supplied to the gates of the sixth transistor 112 and the ninth transistor 118 which form the gain stage 122. Note that a state in which the potential $V_{\_osg}$ is sufficiently supplied refers to a state in which the seventh transistor 114 and the eighth transistor 116 are on.

In other words, the voltage follower 100 in which the seventh transistor 114 and the eighth transistor 116 are on operates like the conventional voltage follower.

In the case where the seventh transistor 114 and the eighth transistor 116 are turned off (supply of the potential $V_{\_osg}$ is stopped) with the output potential $V_{\_out}$ which is equivalent to the input potential $V_{\_in}$ output constantly, a node_1 (corresponding to a portion indicated by a heavy line in FIG. 1) between the second terminal of the seventh transistor 114 and the gate of the sixth transistor 112 and a node_2 (corresponding to a portion indicated by a heavy line in FIG. 1) between the second terminal of the eighth transistor 116 and the gate of the ninth transistor 118 each become a floating state because the seventh transistor 114 and the eighth transistor 116 are each the transistor with low off-state current.

The potential of the node_1 is the potential supplied from the differential amplifier 120 and does not fluctuate through the seventh transistor 114, thereby being held constant. The potential of the node_2 is the potential which is equivalent to the reference potential $V_{\_bias}$ and does not fluctuate through the eighth transistor 116, thereby being held constant.

Thus, the potential supplied to the gate of the sixth transistor 112 and the potential supplied to the gate of the ninth transistor 118, which are necessary to output the output potential $V_{\_out}$ which is equivalent to the input potential $V_{\_in}$, can be held constant in the node_1 and the node_2.

Therefore, the voltage follower 100 does not need to supply the input potential $V_{\_in}$ and the reference potential $V_{\_bias}$ constantly, and even when the supply of the input potential $V_{\_in}$ and the reference potential $V_{\_bias}$ is stopped, the output potential $V_{\_out}$ which is equivalent to the input potential $V_{\_in}$ right before stopping the supply of the potential $V_{\_osg}$ can be output as long as the power supply is turned on, on the basis of the held potential of the node_1 and the held potential of the node_2. That is, the voltage follower 100 can operate even when the peripheral circuit such as the circuit which generates the input potential $V_{\_in}$ and the reference potential $V_{\_bias}$ is stopped; therefore, the power consumption of the voltage follower 100 can be reduced.

Note that in this specification, low power operation refers to the following operation: in a voltage follower according to one embodiment of the present invention, in which an input potential $V_{\_in}$, a reference potential $V_{\_bias}$, and a potential $V_{\_osg}$ are sufficiently supplied, an output potential $V_{\_out}$ which is equivalent to the input potential $V_{\_in}$ is output by turning off a transistor with low off-state current and stopping the supply of the input potential $V_{\_in}$ and the reference potential $V_{\_bias}$.

In order to change the output potential $V_{\_out}$ of the voltage follower 100, which is output during the low power operation, it is only necessary to turn on again the seventh transistor 114 and the eighth transistor 116 and turn off the seventh transistor 114 and the eighth transistor 116 after an input potential $V_{\_in}$ which is equivalent to a desired output potential $V_{\_out}$ is sufficiently supplied.

In addition, the potential of the node_1 and the potential of the node_2 are held constant even in the case where the power supply of the voltage follower 100 is turned off during the low power operation; therefore, when the power supply is turned on again, the output potential $V_{\_out}$ which is output just before the power supply is turned off can be output again without supplying an input potential $V_{\_in}$, a reference potential $V_{\_bias}$, and a potential $V_{\_osg}$. Therefore, when the power supply is turned on again, the circuit of the voltage follower 100 is started more quickly than that in the conventional circuit configuration.

In the voltage follower 100, the fifth transistor 110 and the ninth transistor 118 each serve as a constant current source. Thus, resistors or the like can be substituted for the fifth transistor 110 and the ninth transistor 118.

Further, there is no limitation on electrical connection of the transistors each serving as a constant current source (the fifth transistor 110 and the ninth transistor 118) to the power supply potential line $V_{ss}$ as long as the gain stage 122 can be provided with the transistors with low leakage current in an off state and the potential supplied from the differential amplifier can be held in the voltage follower 100. That is, a voltage follower in which the transistors each serving as a constant current source are electrically connected to a power supply potential line $V_{dd}$ is also included in one embodiment of the present invention. Note that when the transistors each serving as a constant current source are electrically connected to a power supply potential line $V_{dd}$, the connection relations of the other transistors which form the differential amplifier 120 and the gain stage 122 are changed as appropriate.

As an example of the transistor having the above off-state current value which can be used as the seventh transistor 114 and the eighth transistor 116, a transistor whose channel formation region is formed in a wide-gap semiconductor layer such as an oxide semiconductor layer can be given. Further, in the oxide semiconductor, hydrogen which serves as a carrier supplier is preferably reduced to an extremely low level. Therefore, in the channel formation region of the oxide semiconductor layer, the hydrogen concentration is preferably lower than or equal to $5 \times 10^{19}/cm^3$, more preferably the hydrogen concentration is lower than or equal to $5 \times 10^{18}/cm^3$ and the oxygen proportion is in excess of the stoichiometric composition ratio. The hydrogen concentration in the oxide semiconductor used for forming the channel formation region is measured by secondary ion mass spectrometry (SIMS).

The oxide semiconductor layer is preferably formed using a metal oxide containing at least indium (In) or zinc (Zn). In particular, In and Zn are preferably contained. As a stabilizer for reducing variation in electric characteristics of a transistor including the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

The carrier concentration in the oxide semiconductor layer is preferably lower than $1.0 \times 10^{14}/cm^3$. By decreasing the carrier concentration, the off-state current of the transistor can be reduced.

In the voltage follower 100, there is no limitation on a semiconductor material used for the first transistor 102, the second transistor 104, the third transistor 106, the fourth transistor 108, the fifth transistor 110, the sixth transistor 112, and the ninth transistor 118. For example, a silicon semiconductor material is used.

Note that as the third transistor 106, the fourth transistor 108, the fifth transistor 110, and the ninth transistor 118, the transistor whose channel formation region is formed using a wide-gap semiconductor such as an oxide semiconductor may be provided.

Through the above, the voltage follower which is a semiconductor device according to one embodiment of the present invention consumes less power than the conventional voltage follower does. In addition, power consumption is reduced also in a semiconductor device including the voltage follower.

Note that the circuit configuration of the voltage follower which is a semiconductor device according to one embodiment of the present invention is not limited to that described in this embodiment as long as a potential supplied from a differential amplifier can be held constant by providing a gain stage with a transistor with low leakage current in an off state. For example, each of the differential amplifier and the gain stage may be provided with another transistor.

Note that the contents of this embodiment or part thereof can be combined freely with the contents of other embodiments or part thereof.

Embodiment 2

In this embodiment, a configuration example of the semiconductor device whose configuration is partly different from that shown in Embodiment 1, will be described.

Although the voltage follower 100 described in Embodiment 1 includes two stages of the differential amplifier 120 and the gain stage 122, the configuration of the voltage follower according to one embodiment of the present invention is not limited this configuration. For example, a gain stage may be provided between the differential amplifier and the output stage.

Figure 3:
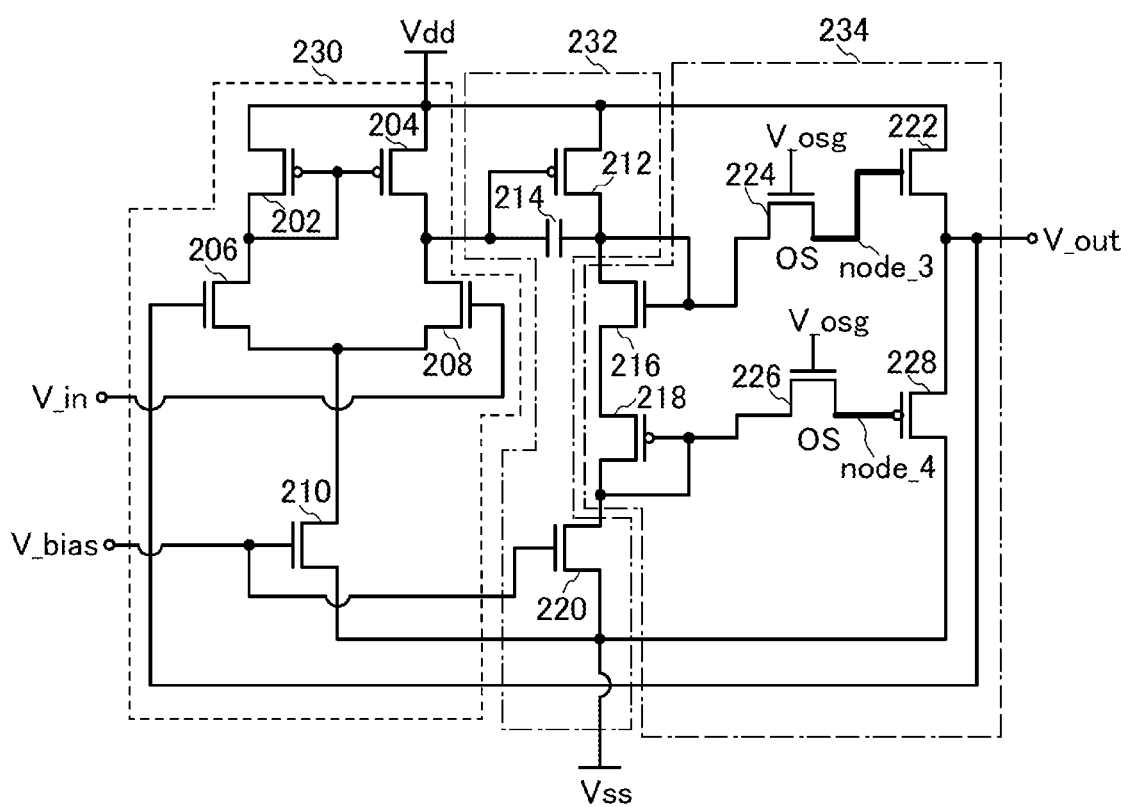
FIG. 3 is a circuit diagram illustrating an example of a voltage follower according to one embodiment of the present invention.

For example, FIG. 3 illustrates a voltage follower 200 which is a configuration example of a voltage follower including three stages a differential amplifier 230, a gain stage 232, and an output stage 234. Note that the voltage follower 200 is a variation example of the voltage follower 100; thus, the reference numerals of the voltage follower 100 are used as appropriate in FIG. 3.

A voltage follower 200 in FIG. 3 includes first to thirteenth transistors and one capacitor. The connection relations of the transistors and the capacitor are described below.

A first terminal of a first transistor 202 and a first terminal of a second transistor 204 are electrically connected to a power supply potential line $V_{dd}$; a second terminal of the first transistor 202 is electrically connected to a gate of the first transistor 202, a gate of the second transistor 204, and a first terminal of a third transistor 206; a second terminal of the second transistor 204 is electrically connected to a first terminal of a fourth transistor 208; a second terminal of the third transistor 206 and a second terminal of the fourth transistor 208 are electrically connected to a first terminal of a fifth transistor 210; and a second terminal of the fifth transistor 210 is electrically connected to a power supply potential line $V_{ss}$.

A first terminal of a sixth transistor 212 is electrically connected to the power supply potential line $V_{dd}$; the second terminal of the second transistor 204 and the first terminal of the fourth transistor 208 are electrically connected to a gate of the sixth transistor 212 and one electrode of a capacitor 214; a second terminal of the sixth transistor 212 and the other electrode of the capacitor 214 are electrically connected to a first terminal of a seventh transistor 216 and a gate of the seventh transistor 216; a second terminal of the seventh transistor 216 is electrically connected to a first terminal of an eighth transistor 218; a second terminal of the eighth transistor 218 is electrically connected to a gate of the eighth transistor 218 and a first terminal of a ninth transistor 220; and a second terminal of the ninth transistor 220 is electrically connected to the power supply potential line $V_{ss}$.

A first terminal of a tenth transistor 222 is electrically connected to the power supply potential line $V_{dd}$; a first terminal of an eleventh transistor 224 is electrically connected to the gate of the seventh transistor 216; a gate of the tenth transistor 222 is electrically connected to a second terminal of the eleventh transistor 224; a first terminal of a twelfth transistor 226 is electrically connected to the gate of the eighth transistor 218; a second terminal of the twelfth transistor 226 is electrically connected to a gate of a thirteenth transistor 228; a second terminal of the tenth transistor 222 is electrically connected to a first terminal of the thirteenth transistor 228; and a second terminal of the thirteenth transistor 228 is electrically connected to the power supply potential line $V_{ss}$.

A gate of the fourth transistor 208 is electrically connected to a first input terminal to which an input potential $V_{\_in}$ is input; a gate of the third transistor 206, the second terminal of the tenth transistor 222, and the first terminal of the thirteenth transistor 228 are electrically connected to an output terminal from which an output potential $V_{\_out}$ is output; and a gate of the fifth transistor 210 and a gate of the ninth transistor 220 are electrically connected to a second input terminal to which a reference potential $V_{\_bias}$ is input.

The first transistor 202, the second transistor 204, the sixth transistor 212, the eighth transistor 218, and the thirteenth transistor 228 are p-channel transistors; the third transistor 206, the fourth transistor 208, the fifth transistor 210, the seventh transistor 216, the ninth transistor 220, the tenth transistor 222, the eleventh transistor 224, and the twelfth transistor 226 are n-channel transistors.

The eleventh transistor 224 and the twelfth transistor 226 are each a transistor whose leakage current in an off state (an off-state current) per micrometer of a channel width is lower than or equal to $1 \times 10^{-17}$ A. The off-state current is preferably lower than or equal to $1 \times 10^{-18}$ A, more preferably lower than or equal to $1 \times 10^{-21}$ A, further preferably $1 \times 10^{-24}$ A.

In the voltage follower 200, a circuit group including the first transistor 202, the second transistor 204, the third transistor 206, the fourth transistor 208, and the fifth transistor 210 is to be referred to as differential amplifier 230.

In the voltage follower 200, a circuit group including the sixth transistor 212, the capacitor 214, and the ninth transistor 220 is to be referred to as gain stage 232.

In the voltage follower 200, a circuit group including the seventh transistor 216, the eighth transistor 218, the tenth transistor 222, the eleventh transistor 224, the twelfth transistor 226, and the thirteenth transistor 228 is to be referred to as output stage 234.

The output potential $V_{\_out}$ which is equivalent to the input potential $V_{\_in}$ is output in a manner similar to that of the conventional voltage follower from the voltage follower 200 in which the eleventh transistor 224 and the twelfth transistor 226 are on.

In the case where the eleventh transistor 224 and the twelfth transistor 226 are turned off (supply of the potential $V_{\_osg}$ is stopped) with the output potential $V_{\_out}$ which is equivalent to the input potential $V_{\_in}$ output constantly, a node_3 (corresponding to a portion indicated by a heavy line in FIG. 3) between the second terminal of the eleventh transistor 224 and the gate of the tenth transistor 222 and a node_4 (corresponding to a portion indicated by a heavy line in FIG. 3) between the second terminal of the twelfth transistor 226 and the gate of the thirteenth transistor 228 each become a floating state because the eleventh transistor 224 and the twelfth transistor 226 are each the transistor with low off-state current.

The potential of the node_3 is the potential supplied from the gain stage 232 and does not fluctuate through the eleventh transistor 224, thereby being held constant. The potential of the node_4 is the potential supplied from the gain stage 232 on the basis of the reference potential $V_{\_bias}$ and does not fluctuate through the twelfth transistor 226, thereby being held constant.

Therefore, the voltage follower 200 can perform low power operation; thus, the power consumption of the voltage follower 200 can be reduced.

For example, in the case where the channel widths of the transistors (also simply referred to as the sizes of the transistors) included in the output stage 234 are extremely longer (larger) than the channel widths (sizes) of the transistors included in the differential amplifier 200, delay occurs in supply of a potential for outputting the output potential $V_{\_out}$ which is equivalent to the input potential $V_{\_in}$ to the gate of the tenth transistor 222 and the gate of the thirteenth transistor 228.

At this time, the occurrence of the delay can be suppressed by providing the gain stage 232 with transistors whose channel widths (sizes) are longer (larger) than the those of the transistors included in the differential amplifier 230 and are shorter (smaller) than those of the transistors included in the output stage 234. That is, the delay can be suppressed by providing the gain stage as in the voltage follower 200; therefore, an output potential $V_{\_out}$ which is equivalent to an input potential $V_{\_in}$ can be output stably.

In order to change the output potential $V_{\_out}$ of the voltage follower 200, which is output during the low power operation, it is only necessary to turn on again the eleventh transistor 224 and the twelfth transistor 226 and turn off the eleventh transistor 224 and the twelfth transistor 226 after the state in which an input potential $V_{\_in}$ which is equivalent to a desired output potential $V_{\_out}$ is sufficiently supplied. Note that a state in which the input potential $V_{\_in}$ is sufficiently supplied refers to a state in which current flows constantly between the first terminal and the second terminal of the fourth transistor 208 by an input potential $V_{\_in}$.

In addition, even in the case where the power supply of the voltage follower 200 is turned off during the low power operation, when the power supply is turned on again, the output potential $V_{\_out}$ which is output just before the power supply is turned off can be output in a manner similar to that of the voltage follower 100. Therefore, when the power supply is turned on again, the circuit of the voltage follower 200 is started more quickly than that in the conventional circuit configuration.

In the voltage follower 200, the fifth transistor 210, the ninth transistor 220, and the thirteenth transistor 228 each serve as a constant current source. Thus, resistors or the like can be substituted for the fifth transistor 210, the ninth transistor 220, and the thirteenth transistor 228. Even in the case where resistors are substituted for the constant current sources provided in the gain stage 232, the node_4 can hold a potential by providing in the output stage 234 with the twelfth transistor 226. Therefore, the voltage follower 200 can perform low power operation.

Further, there is no limitation on electrical connection of the transistors each serving as a constant current source (the fifth transistor 210 and the ninth transistor 220) to the power supply potential line $V_{ss}$ as long as the output stage 234 can be provided with the transistors with low leakage current in an off state and the potentials supplied from the gain stage 232 can be held in the voltage follower 200. That is, a voltage follower in which the transistors each serving as a constant current source are electrically connected to a power supply potential line $V_{dd}$ is also included in one embodiment of the present invention. Note that when the transistors each serving as a constant current source are electrically connected to a power supply potential line $V_{dd}$, the connection relations of the other transistors which form the differential amplifier 230 and the output stage 234 are changed as appropriate.

As an example of the transistor having the above off-state current value which can be used as the eleventh transistor 224 and the twelfth transistor 226, a transistor whose channel formation region is formed in a wide-gap semiconductor layer such as an oxide semiconductor layer can be given as described in Embodiment 1. Therefore, in the channel formation region of the oxide semiconductor layer in each of the eleventh transistor 224 and the twelfth transistor 226, the hydrogen concentration is preferably lower than or equal to $5\times10^{19}/cm^3$, more preferably the hydrogen concentration is lower than or equal to $5\times10^{18}/cm^3$ and the oxygen proportion is in excess than that in the stoichiometric composition ratio. The carrier concentration in the oxide semiconductor layer is preferably lower than $1.0\times10^{14}/cm^3$. By decreasing the carrier concentration, the off-state current of the transistor can be reduced. The oxide semiconductor layer is formed using the metal oxide film described in Embodiment 1.

In the voltage follower 200, there is no limitation on a semiconductor material used for the first transistor 202, the second transistor 204, the third transistor 206, the fourth transistor 208, the fifth transistor 210, the sixth transistor 212, the seventh transistor 216, the eighth transistor 218, the ninth transistor 220, the tenth transistor 222, and the thirteenth transistor 228. For example, a silicon semiconductor material is used.

Note that as the third transistor 206, the fourth transistor 208, the fifth transistor 210, the seventh transistor 216, the ninth transistor 220, and the tenth transistor 222, the transistor whose channel formation region is formed using a wide-gap semiconductor such as an oxide semiconductor may be provided.

The capacitor 214 includes a pair of electrodes formed using a conductive film and an insulating film provided between the pair of electrodes. The capacitor 214 can be formed using the step of forming any of the transistors included in the voltage follower 200.

Through the above, the voltage follower which is a semiconductor device according to one embodiment of the present invention consumes less power than the conventional voltage follower does. In addition, power consumption is reduced also in a semiconductor device including the voltage follower.

Note that the circuit configuration of the voltage follower which is a semiconductor device according to one embodiment of the present invention is not limited to that described in this embodiment as long as a potential supplied from a gain stage can be held constant by providing an output stage with a transistor with low leakage current in an off state. For example, each of a differential amplifier, the gain stage, and the output stage may be provided with another transistor.

Further, the semiconductor device according to one embodiment of the present invention can be applied to various applications including an operational amplifier, an amplifier circuit, a comparator, and the like.

For example, the semiconductor device according to one embodiment of the present invention can be used as an operational amplifier for outputting an output potential on the basis of a potential difference between two inputs.

Figure 24:
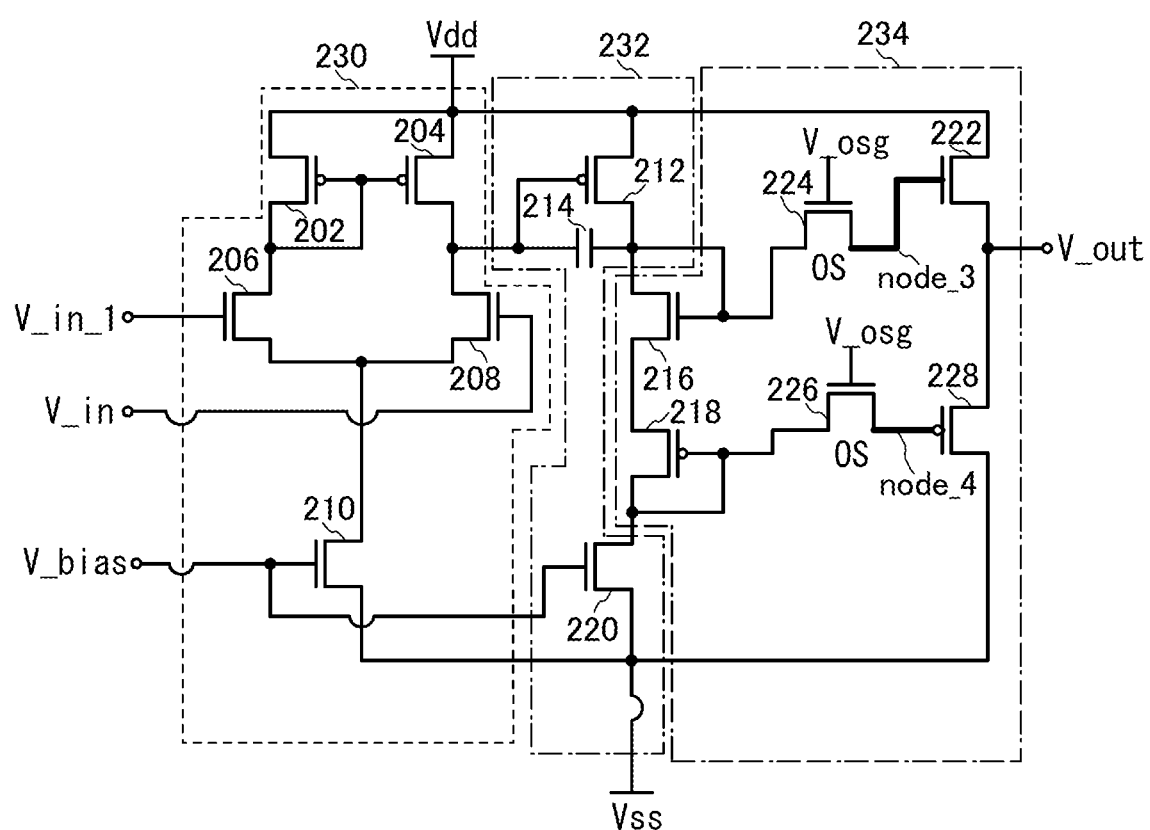
FIG. 24 is a circuit diagram illustrating an operational amplifier according to one embodiment of the present invention.

The operational amplifier can be configured as follows: in the circuit configuration of the voltage follower 200 in FIG. 3, another input potential $V_{\_in1}$ is supplied instead of the output potential $V_{\_out}$ as the potential supplied to the gate of the third transistor 206. For example, the gate of the third transistor 206 of the voltage follower 200 can be connected to a third input terminal to which an input potential $V_{in1}$ is input instead of the second terminal of the tenth transistor 222, the first terminal of the thirteenth transistor 228, and the output terminal (see FIG. 24).

The operation of the operational amplifier is as follows: the potential supplied to the gate of the sixth transistor 212 is lowered by a difference between the input potential ($V_{\_in1}$) supplied to the gate of the third transistor 206 and an input potential ($V_{\_in}$) supplied to the gate of the fourth transistor 208. When the potential supplied to the gate of the sixth transistor 212 is lowered, the sixth transistor 212 tends to have a large amount of on-state current (on state) and the potential supplied to the gate of the tenth transistor 222 is raised. Accordingly, the potential of the second terminal of the tenth transistor 222 (the potential of the output terminal or a source potential), that is, the output potential $V_{\_out}$ is also raised.

The operational amplifier does not need to be supplied with the input potential $V_{\_in}$, the input potential $V_{\_in1}$, and the reference potential $V_{\_bias}$ constantly like the voltage follower. Even when the supply of the input potential $V_{\_in}$, the input potential $V_{\_in1}$, and the reference potential $V_{\_bias}$ is stopped, the potential right before stopping the supply can be output as long as the power supply is turned on, on the basis of the held potential of the node_3 and the held potential of the node_4. That is, the operational amplifier can operate even when the peripheral circuit such as the circuit which generates the input potential $V_{\_in}$, the input potential $V_{\_in1}$, and the reference potential $V_{\_bias}$ is stopped; therefore, the power consumption of the operational amplifier can be reduced. That is, the operational amplifier according to one embodiment of the present invention can perform low power operation.

In order to change the output potential $V_{\_out}$ of the operational amplifier according to one embodiment of the present invention, which is output during the low power operation, it is only necessary to turn on again the eleventh transistor 224 and the twelfth transistor 226 and turn off the eleventh transistor 224 and the twelfth transistor 226 after an input potential $V_{\_in}$ and an input potential $V_{in1}$ which are changed into desired potentials are sufficiently supplied.

In addition, even in the case where the power supply of the operational amplifier according to one embodiment the present invention is turned off during the low power operation, when the power supply is turned on again, the output potential $V_{\_out}$ which is output just before the power supply is turned off can be output again in a manner similar to that of the voltage follower 100 and the voltage follower 200. Therefore, when the power supply is turned on again, the circuit of the operational amplifier according to one embodiment of the present invention is started more quickly than that in the conventional circuit configuration.

Note that the circuit configuration of the operational amplifier which is a semiconductor device according to one embodiment of the present invention is not limited to that described in this embodiment as long as a potential supplied from a differential amplifier can be held constant by providing an output stage with a transistor with low leakage current in an off state. For example, a plurality of gain stages may be provided, or each of the differential amplifier, the gain stage, and the output stage may be provided with another transistor.

Through the above, the operational amplifier which is a semiconductor device according to one embodiment of the present invention consumes less power than the conventional voltage follower does. In addition, power consumption is reduced also in a semiconductor device including the operational amplifier.

Here, advantages of using a transistor with extremely low off-state current in a semiconductor device according to one embodiment of the present invention will be described.

The semiconductor device according to one embodiment of the present invention includes the transistor with extremely low off-state current; therefore, when the power supply is turned on again, the output potential $V_{\_out}$ which is output just before the power supply is turned off can be output again. This is because nonvolatility can be achieved by a transistor including an oxide semiconductor.

In addition, a nonvolatile semiconductor device can be achieved by using a magnetic tunnel junction element (MTJ element) utilizing spintronics. The MTJ element stores data by setting a low-resistance state when the magnetization directions of ferromagnetic films provided above and below an insulating film are parallel, or a high-resistance state when the directions thereof are anti-parallel. Thus, in achieving nonvolatility, the principle of the MTJ element is completely different from that of an oxide semiconductor as in the semiconductor device according to one embodiment of the present invention.

Now, comparison is made between a nonvolatile semiconductor device including the MTJ element and a nonvolatile semiconductor device including the transistor including an oxide semiconductor with reference to Table 1.

TABLE 1

|  | Spintronics (MTJ element) | Oxide semiconductor/Si |
|---|---|---|
| Heat resistance | Curie temperature | Process temperature around 500° C. (Reliability at 150° C.) |
| Driving method | Current driving | Voltage driving |
| Writing principle | Changing magnetization direction of ferroelectric body | On/off of FET |
| Si LSI | Suitable for bipolar LSI (MOS device is preferable | Suitable for MOS LSI |

TABLE 1-continued

|  | Spintronics (MTJ element) | Oxide semiconductor/Si |
|---|---|---|
| Overhead | for high integration because bipolar device is unsuitable for high integration. Note that W gets larger.) Large (Because of high Joule heat) | Smaller by 2 to 3 or more orders of magnitude than the MTJ element (Because of charging and discharging of parasitic capacitance) |
| Nonvolatility | Utilizing spin | Utilizing low off-state current |
| Write cycle number | Without limitation | Without limitation |
| 3D conversion | Difficult (at most two layers) | Easy (the number of layers is limitless) |
| Material | Magnetic rare-earth element | Oxide semiconductor material |
| Element cost | High | Low (Might be slightly high depending on oxide semiconductor material (such as In)) |

As shown in Table 1, the MTJ element is current-driven, so that a potential is input or held by changing the magnetization direction of the ferromagnetic film. In contrast, the transistor including an oxide semiconductor is voltage-driven, so that a potential is input or held by switching the on and off states of the transistor.

In theory, both the MTJ element and the transistor including an oxide semiconductor can achieve nonvolatility without limitation on the number of times electric charge can be held.

The MTJ element has a disadvantage in that a magnetic property is lost when the temperature is higher than or equal to the Curie temperature because a magnetic material is used. In addition, the MTJ element is compatible with a silicon bipolar device because current driving is employed; however, the bipolar device is unsuitable for high integration. Further, there is a problem in that power consumption is increased with the increase in the memory capacity, though the MTJ element requires low write current.

In order to achieve high integration of semiconductor devices, a variety of elements are stacked to obtain three-dimensional integration. However, such three-dimensional integration is difficult for semiconductor devices including MTJ elements. In contrast, semiconductor devices including transistors including an oxide semiconductor are suitable for stacked three-dimensional integration.

In principle, the MTJ element has low resistance to a magnetic field, so that the magnetization direction is likely to change when the MTJ element is exposed to a high magnetic field. Further, it is necessary to control magnetic fluctuation due to nanoscaling of a magnetic body used for the MTJ element.

In addition, a rare earth element is used for the MTJ element; thus, it requires special attention to incorporate a process of forming the MTJ element in a process of forming a silicon semiconductor that is sensitive to metal contamination. The material cost per bit of the MTJ element is expensive.

On the other hand, the transistor including an oxide semiconductor has an element structure and an operation principle which are similar to those of a silicon MOSFET except that the channel formation region is formed using a semiconductor material such as a metal oxide. Further, the transistor including an oxide semiconductor layer is not affected by a magnetic field. Therefore, the semiconductor device according to one embodiment of the present invention has a high stability against the magnetic field compared to a nonvolatile semiconductor device including the MTJ element. Further, the semiconductor device according to one embodiment of the present invention may be highly compatible with a silicon integrated circuit.

From the above, in order to achieve a nonvolatile semiconductor device, a transistor with extremely low off-state current, in particular, a transistor including an oxide semiconductor is preferably used.

Note that the contents of this embodiment or part thereof can be combined freely with the contents of other embodiments or part thereof.

Embodiment 3

In this embodiment, a method for manufacturing a transistor included in the semiconductor device described in any of the above embodiments will be described.

In the voltage follower described in any of the above embodiments, the p-channel and n-channel transistors are formed by a general method using a substrate including a semiconductor material. Note that in this embodiment, one of the p-channel and n-channel transistors is illustrated over a semiconductor substrate for simplicity of the drawings.

A transistor with extremely low off-state current is formed in the following manner: p-channel and n-channel transistors are formed over a substrate including a semiconductor material and then a transistor including an oxide semiconductor is formed over the p-channel and n-channel transistors. In addition, a semiconductor substrate 700 over which p-channel and n-channel transistors are provided is used as a formation substrate and a transistor including an oxide semiconductor is provided over the substrate, whereby the area occupied by the transistors in the voltage follower can be reduced; thus, miniaturization of the voltage follower can be achieved.

Figure 4:
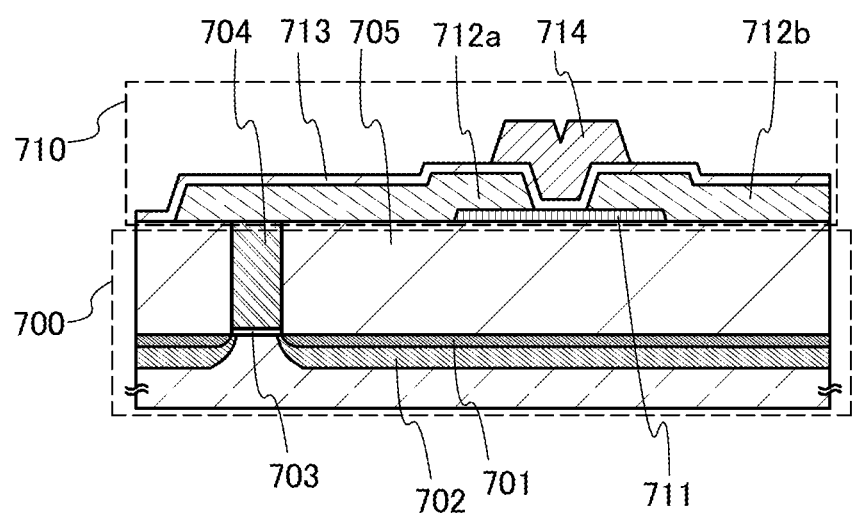
FIG. 4 is a cross-sectional view illustrating a transistor according to one embodiment of the present invention.

The semiconductor substrate 700 over which the p-channel or n-channel transistor is formed includes a high-concentration impurity region 701 serving as a source and a drain, a low-concentration impurity region 702, a gate insulating film 703, a gate electrode 704, and an interlayer insulating film 705 (see FIG. 4).

A transistor 710 whose channel formation region is formed in an oxide semiconductor layer includes an oxide semiconductor layer 711 formed over the semiconductor substrate 700 over which the p-channel or n-channel transistor is provided, a source electrode 712a and a drain electrode 712b which are formed separately from each other and are in contact with the oxide semiconductor layer 711, a gate insulating film 713 formed over at least the channel formation region of the oxide semiconductor layer 711, and a gate electrode 714 formed over the gate insulating film 713 to overlap with the oxide semiconductor layer 711 (see FIG. 4).

The interlayer insulating film 705 also serves as a base insulating film of the oxide semiconductor layer 711.

The interlayer insulating film 705 contains oxygen at least in its surface, and is formed using an insulating oxide from which part of the oxygen is desorbed by a heat treatment. As an insulating oxide from which part of oxygen is desorbed by a heat treatment, a material in which the oxygen proportion is higher than that in the stoichiometric composition ratio is preferably used. This is because oxygen can be supplied to the oxide semiconductor layer 711 which is in contact with the interlayer insulating film 705 by the heat treatment.

As the insulating oxide in which the oxygen proportion is higher than that in the stoichiometric composition ratio, silicon oxide represented by $SiO_x$ where x>2 can be given, for example. However, the interlayer insulating film 705 may be, without limitation, formed using silicon oxide, silicon oxynitride, silicon nitride oxide, aluminum oxide, aluminum oxynitride, gallium oxide, hafnium oxide, yttrium oxide, or the like.

Note that the interlayer insulating film 705 may be formed by a plurality of stacked films. For example, the interlayer insulating film 705 may have a layered structure in which a silicon oxide film is formed over a silicon nitride film.

From an insulating oxide in which the oxygen proportion is higher than that in the stoichiometric composition ratio, part of the oxygen is easily desorbed by a heat treatment. The amount of desorbed oxygen (the value converted into that of oxygen atoms) obtained by TDS analysis when part of oxygen is easily desorbed by a heat treatment is greater than or equal to $1.0 \times 10^{18}$ atoms/cm$^3$, preferably greater than or equal to $1.0 \times 10^{20}$ atoms/cm$^3$, more preferably greater than or equal to $3.0 \times 10^{20}$ atoms/cm$^3$.

Here, a method using the TDS analysis is described. The amount of a desorbed gas in the TDS analysis is proportional to an integral value of a TDS spectrum. Thus, from the integral value of a TDS spectrum of an oxide to a reference value of a standard sample, the amount of the desorbed gas can be calculated. The reference value of a standard sample refers to, in a sample (standard sample) containing a predetermined atom, the ratio of the density of the predetermined atom to the integral value of a spectrum.

For example, from a TDS spectrum of a silicon wafer (standard sample) containing hydrogen at a predetermined density and a TDS spectrum of an oxide, the amount ($N_{O2}$) of desorbed oxygen molecules ($O_2$) of the oxide can be obtained by the following formula.

[FORMULA 1]

$$N_{O2} = \frac{N_{H2}}{S_{H2}} \times S_{O2} \times \alpha$$

$N_{H2}$ is a value obtained by conversion of the number of hydrogen molecules ($H_2$) desorbed from the standard sample into density. $S_{H2}$ is an integral value of a TDS spectrum of hydrogen molecules ($H_2$) of the standard sample. In other words, the reference value of the standard sample is $N_{H2}/S_{H2}$. $S_{O2}$ is an integral value of a TDS spectrum of oxygen molecules ($O_2$) of the insulating oxide. $\alpha$ is a coefficient affecting the intensity of the TDS spectrum. Refer to Japanese Published Patent Application No. H06-275697 for details of the above formula.

Note that the amount of the desorbed oxygen obtained by the TDS analysis (the value converted into that of oxygen atoms) is measured using a silicon wafer containing hydrogen atoms at $1 \times 10^{16}$ atoms/cm$^3$ as the standard sample, by using a thermal desorption spectrometer, EMD-WA1000S/W manufactured by ESCO, Ltd.

In the TDS analysis, oxygen is partly detected as an oxygen atom. The ratio between oxygen molecules and oxygen atoms can be calculated from the ionization rate of the oxygen molecules. Since the coefficient $\alpha$ includes the ionization rate of the oxygen molecules, the number of the released oxygen atoms can also be calculated through the evaluation of the number of the released oxygen molecules.

In addition, $N_{O2}$ is the amount of desorbed oxygen molecules ($O_2$). Therefore, the amount of desorbed oxygen converted into oxygen atoms is twice the number of desorbed oxygen molecules ($O_2$).

The interlayer insulating film 705 is formed by a sputtering method, a CVD method, or the like, preferably a sputtering method. When a silicon oxide film is formed as the interlayer insulating film 705, a quartz (preferably synthesized quartz) target is used as a target and an argon gas is used as a sputtering gas. Alternatively, a silicon target may be used as a target and a gas containing oxygen may be used as a sputtering gas. As the gas containing oxygen, a mixed gas of an argon gas and an oxygen gas may be used or only an oxygen gas may be used.

After the interlayer insulating film 705 is formed and before an oxide semiconductor film to be processed into the oxide semiconductor layer 711 is formed, a first heat treatment is performed. The first heat treatment is a step for removing water and hydrogen contained in the interlayer insulating film 705. Therefore, the temperature of the first heat treatment is preferably higher than or equal to a temperature at which water and hydrogen contained in the interlayer insulating film 705 is desorbed (temperature at which the amount of desorbed water and hydrogen has a peak) and lower than a temperature at which the semiconductor substrate 700 over which the p-channel or n-channel transistor is formed is changed in quality or deformed, for example, lower than the temperature of a second heat treatment performed later.

Then, after the oxide semiconductor film is formed, the second heat treatment is performed. The second heat treatment is a step for removing water and hydrogen from the oxide semiconductor film, which is mixed therein when the oxide semiconductor film is formed and further is a step for supplying oxygen to the oxide semiconductor film by using the interlayer insulating film 705 as a supply source of oxygen. The second heat treatment is preferably performed at a temperature higher than or equal to 200° C. and lower than the strain point of the semiconductor substrate 700, for example. However, the timing of the second heat treatment is not limited thereto, and may be after the oxide semiconductor film is processed into the oxide semiconductor layer 711. The concentration of hydrogen in the oxide semiconductor film is reduced in this manner, whereby the threshold voltage of the transistor can be prevented from shifting to the negative direction.

As the step for supplying oxygen to the oxide semiconductor film, it is possible to perform an oxygen doping treatment by using oxygen plasma or an oxygen doping treatment by using an ion implantation method. By the oxygen doping treatment by an ion implantation method, oxygen can be excessively contained in the oxide semiconductor film. By the second heat treatment or the oxygen doping treatment after the second heat treatment, variations in electric characteristics of the transistor 710 to be formed can be reduced.

Note that it is preferable that in the second heat treatment, hydrogen, water, a hydroxyl group, hydride, and the like be not contained in a nitrogen gas or a rare gas such as a helium gas, a neon gas, or an argon gas. Alternatively, the purity of a nitrogen gas or a rare gas such as a helium gas, a neon gas, or an argon gas that is introduced into the heat treatment apparatus is preferably higher than or equal to 6N (99.9999%), more preferably higher than or equal to 7N (99.99999%) (that is, the impurity concentration is 1 ppm or lower, preferably 0.1 ppm or lower).

Further, the crystallinity of the oxide semiconductor film or the oxide semiconductor layer 711 might be a single crystal structure or a non-single-crystal structure depending on conditions of the second heat treatment or a material of the oxide semiconductor film or the oxide semiconductor layer 711. The non-single-crystal structure includes a microcrystalline structure and a polycrystalline structure. For example, the oxide semiconductor film or the oxide semiconductor layer 711 is a microcrystalline semiconductor layer having a degree of crystallization of 90% or more, or 80% or more. Moreover, the non-single-crystal structure includes an amorphous structure including no crystal region and an amorphous structure including a crystal region. An example of the amorphous structure including a crystal region is an oxide semiconductor layer in which a portion of microcrystals (with a grain diameter of greater than or equal to 1 nm and less than or equal to 20 nm, typically greater than or equal to 2 nm and less than or equal to 4 nm) is mixed into an amorphous structure.

The average surface roughness (Ra) of the interlayer insulating film 705 which is a surface over which the oxide semiconductor film or the oxide semiconductor layer 711 is to be formed is preferably less than or equal to 1 nm, preferably less than or equal to 0.3 nm in order to align the crystal orientation when the oxide semiconductor film is crystalline. By increasing the planarity of the interlayer insulating film 705 over which the oxide semiconductor film or the oxide semiconductor layer 711 is to be formed, the oxide semiconductor film or the oxide semiconductor layer 711 can have high surface planarity; thus, a transistor having higher field-effect mobility can be obtained.

In the case of the oxide semiconductor film or the oxide semiconductor layer 711 having an amorphous structure, a flat surface can be obtained relatively easily, so that when a transistor is formed with the use of such an oxide semiconductor film, interface scattering can be reduced, and relatively high field-effect mobility can be obtained relatively easily.

In the case of the oxide semiconductor film or the oxide semiconductor layer 711 having a crystal structure (a single crystal structure, an amorphous structure including a region having crystallinity, a polycrystalline structure, and a microcrystalline structure), defects in the bulk can be further reduced. In that case, the surface flatness of the oxide semiconductor film or the oxide semiconductor layer 711 is improved, a field-effect mobility higher than that in the case of an oxide semiconductor film having an amorphous structure can be obtained. In order to improve the surface flatness, the oxide semiconductor film or the oxide semiconductor layer 711 is preferably formed over a flat surface (in this embodiment, the interlayer insulating film 705); the oxide semiconductor film or the oxide semiconductor layer 711 is formed over a surface with an average surface roughness (Ra) of less than or equal to 1 nm, preferably less than or equal to 0.3 nm, as described above.

Here, the average surface roughness (Ra) is obtained by expanding center line average surface roughness (Ra) which is defined by JIS B 0601:2001 (ISO 4287:1997) into three dimensions so as to be able to apply Ra to a measurement surface. The average surface roughness (Ra) is expressed as an average value of the absolute values of deviations from a reference surface to a specific surface.

Here, the center line average roughness (Ra) is shown by the following formula (1) assuming that a portion having a measurement length L is picked up from a roughness curve in the direction of the center line of the roughness curve, the direction of a center line of the roughness curve of the picked portion is represented by an X-axis, the direction of longitudinal magnification (direction perpendicular to the X-axis) is represented by a Y-axis, and the roughness curve is expressed as Y=F(X).

[FORMULA 2]

$$Ra = \frac{1}{L} \int_0^L |F(X)| dX \quad (1)$$

When the measurement surface which is a surface represented by measurement data is expressed as Z=F(X,Y), the average surface roughness (Ra) is an average value of the absolute values of deviations from the reference surface to the specific surface and is shown by the following formula (2).

[FORMULA 3]

$$Ra = \frac{1}{S_0} \int_{Y_1}^{Y_2} \int_{X_1}^{X_2} |F(X, Y) - Z_0| dX dY \quad (2)$$

Here, the specific surface is a surface which is a target of roughness measurement, and is a rectangular region which is surrounded by four points represented by the coordinates $(X_1, Y_1)$, $(X_1, Y_2)$, $(X_2, Y_1)$, and $(X_2, Y_2)$. The area of the specific surface when the specific surface is flat ideally is denoted by $S_0$.

In addition, the reference surface refers to a surface parallel to an X-Y surface at the average height of the specific surface. In short, when the average value of the height of the specific surface is denoted by $Z_0$, the height of the reference surface is also denoted by $Z_0$.

The average surface roughness (Ra) can be measured using an atomic force microscope (AFM).

To make the average surface roughness of the interlayer insulating film 705 less than or equal to 1 nm, preferably less than or equal to 0.3 nm, as described above, chemical mechanical polishing (CMP) treatment is performed. The CMP treatment is performed before the oxide semiconductor film is formed, preferably before the first heat treatment.

Here, the CMP treatment is performed once or plural times. When the CMP treatment is performed plural times, first polishing is preferably performed with a high polishing rate followed by final polishing with a low polishing rate.

To planarize the interlayer insulating film 705, a plasma treatment or the like may be performed instead of the CMP treatment. A rare gas may be used in the plasma treatment. By the plasma treatment, ions of an inert gas are sputtered onto a process surface so as to planarize minute unevenness on the process surface by the sputtering effect. Such a plasma treatment is also called reverse sputtering.

One or more of the above treatments may be performed in order to planarize the interlayer insulating film 705. For example, only the reverse sputtering may be performed, or the CMP treatment and then the dry etching may be performed. Note that it is preferable to perform the dry etching or the reverse sputtering in order to prevent the entrance of water into the interlayer insulating film 705 over which the oxide semiconductor film is to be formed. In particular, when a planarization treatment is performed after the first heat treatment, the dry etching or the reverse sputtering is preferably performed.

The oxide semiconductor layer 711 may be selectively formed, for example, in a manner such that an oxide semiconductor film is formed, an etching mask is formed thereover, and then etching is performed. Alternatively, an inkjet method or the like may be used.

For the oxide semiconductor film, it is possible to use a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide. Alternatively, it is possible to use a three-component metal oxide such as an In—Ga—Zn-based metal oxide (also referred to as IGZO), an In—Al—Zn-based metal oxide, an In—Sn—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, an In—Lu—Zn-based metal oxide, or a Sn—Ga—Zn-based metal oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, or an In—Ga-based metal oxide; indium oxide; tin oxide; zinc oxide; or the like. Note that an n-component metal oxide includes n kinds of metal oxides. For example, an In—Ga—Zn-based metal oxide means an oxide containing indium (In), gallium (Ga), and zinc (Zn), and there is no particular limitation on the composition ratio thereof. The In—Ga—Zn-based metal oxide may contain an element other than In, Ga, and Zn.

Alternatively, a metal oxide material expressed by 1 nMO$_3$(ZnO)$_m$, (m>0 is satisfied, and m is not an integer) may be used for the oxide semiconductor film. Note that M represents one or more metal elements selected from Ga, Fe, Mn, and Co. Still alternatively, a metal oxide material represented by In$_3$SnO$_5$(ZnO)$_n$ (n>0 is satisfied, and n is an integer) may be used for the oxide semiconductor film.

For example, it is possible to use an In—Ga—Zn-based metal oxide with an atomic ratio of In:Ga:Zn=1:1:1 (=1/3:1/3:1/3) or In:Ga:Zn=2:2:1 (=2/5:2/5:1/5), or any of metal oxides whose composition is in the neighborhood of the above compositions. Alternatively, it is possible to use an In—Sn—Zn-based metal oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of metal oxides whose composition is in the neighborhood of the above compositions.

However, without limitation to the materials given above, a material with an appropriate composition may be used depending on needed semiconductor characteristics (e.g., field-effect mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high field-effect mobility can be obtained relatively easily in the case where the In—Sn—Zn-based metal oxide is used. However, the field-effect mobility can be increased by reducing the defect density in the bulk also in the case where the In—Ga—Zn-based metal oxide is used.

For example, the expression "an In—Ga—Zn-based metal oxide with an atomic composition of In:Ga:Zn=a:b:c (a+b+c=1) which is in the r-neighborhood of an In—Ga—Zn-based metal oxide with an atomic ratio of In:Ga:Zn=A:B:C (A+B+C=1)", means that a, b, and c satisfy the following relation: $(a-A)^2+(b-B)^2+(c-C)^2 \le r^2$, and r may be 0.05, for example. This relation is satisfied with the other metal oxides.

Note that it is preferable that the oxygen proportions in the respective metal oxides be in excess of these stoichiometric composition proportions. Excessive oxygen can prevent generation of carriers due to oxygen vacancies in the oxide semiconductor film to be formed.

Note that the energy gap of a metal oxide which can be applied to the oxide semiconductor film is preferably greater than or equal to 2 eV, more preferably greater than or equal to 2.5 eV, further preferably greater than or equal to 3 eV. In this manner, the off-state current of a transistor can be reduced by using a metal oxide having a wide band gap.

Note that the oxide semiconductor film contains hydrogen. Note that the hydrogen may be contained in the oxide semiconductor film in the form of a hydrogen molecule, water, a hydroxyl group, or hydride in some cases, in addition to a hydrogen atom. It is preferable that hydrogen contained in the oxide semiconductor film be as little as possible.

Note that the concentrations of an alkali metal and an alkaline earth metal in the oxide semiconductor film are preferably low, and these concentrations are preferably lower than or equal to $1 \times 10^{18}$ atoms/cm$^3$, more preferably lower than or equal to $2 \times 10^{16}$ atoms/cm$^3$. When an alkali metal and an alkaline earth metal are bonded to an oxide semiconductor, carriers may be generated, which causes an increase in the off-state current of the transistor.

Note that there is no particular limitation on the formation method and the thickness of the oxide semiconductor film, and they can be determined in consideration of the size or the like of a transistor to be formed. The formation method of the oxide semiconductor film may be, for example, a sputtering method, a coating method, a printing method, a molecular beam epitaxy method, a pulsed laser deposition method, or the like. The thickness of the oxide semiconductor film is greater than or equal to 3 nm and less than or equal to 50 nm. This is because an oxide semiconductor film with a thickness of 50 nm or more may cause normally-on electric characteristics of the transistor to be formed. Further, when the channel length of the transistor is 30 μm, the thickness of the oxide semiconductor film is set to less than or equal to 5 nm to prevent a short channel effect.

For example, in the case where the oxide semiconductor film is formed using an In—Zn-based metal oxide by a sputtering method, a target has a composition ratio where In/Zn is 1 to 100, preferably 1 to 20, more preferably 1 to 10 in an atomic ratio. The atomic ratio of Zn is in the above preferred range, whereby the field-effect mobility can be improved.

Here, when the atomic ratio of the compound is In:Zn:O=X:Y:Z, it is preferable to satisfy the relation of Z>1.5X+Y so that excessive oxygen is contained.

In the case where the oxide semiconductor film is formed using an In—Sn—Zn-based metal oxide by a sputtering method, a target has a composition ratio of In:Sn:Zn=1:2:2, 2:1:3, 1:1:1, 20:45:35, or the like in an atomic ratio. It is preferable that the In—Sn—Zn-based metal oxide also contain excessive oxygen.

In this embodiment, as a preferable example, the oxide semiconductor film is formed by a sputtering method using an In—Ga—Zn-based metal oxide target. A rare gas (e.g., argon), an oxygen gas, or a mixed gas of a rare gas and an oxygen gas is used as a sputtering gas.

Examples of the In—Ga—Zn-based metal oxide target include a target having a composition ratio of $In_2O_3:Ga_2O_3:ZnO=1:1:1$ [molar ratio], a target having a composition ratio of $In_2O_3:Ga_2O_3:ZnO=1:1:2$ [molar ratio], a target having a composition ratio of $In_2O_3:Ga_2O_3:ZnO=1:1:4$ [molar ratio], and a target having a composition ratio of $In_2O_3:Ga_2O_3:ZnO=2:1:8$ [molar ratio].

A high-purity gas in which hydrogen, water, a hydroxyl group, hydride, or the like is removed is preferably used as the sputtering gas for the formation of the oxide semiconductor film. To make the sputtering gas a high-purity gas, a gas attached to an inner wall or the like of a treatment chamber is removed and the semiconductor substrate 700 over which the p-channel or n-channel transistor is formed is subjected to a heat treatment before the oxide semiconductor film is formed. Alternatively, a sputtering gas introduced to the treatment chamber is a high-purity gas. In that case, the purity of an argon gas is higher than or equal to 9N (99.9999999%), the dew point is −121° C., and the concentrations of water and hydrogen are 0.1 ppb and 0.5 ppb, respectively. The purity of an oxygen gas is higher than or equal to 8N (99.999999%), the dew point is −112° C., and the concentrations of water and hydrogen are each 1 ppb. The oxide semiconductor film is formed in a state where the semiconductor substrate 700 over which the p-channel or n-channel transistor is formed is kept at high temperature, whereby the impurity concentration in the oxide semiconductor film can be reduced. Here, the temperature of the semiconductor substrate 700 over which the p-channel or n-channel transistor is formed is higher than or equal to 150° C., preferably higher than or equal to 200° C., more preferably higher than or equal to 400° C. Note that the damage due to hydrogen, water, a hydroxyl group, hydride, or the like which enter the oxide semiconductor film can be reduced by a sputtering method.

In the case where the oxide semiconductor film has a crystalline structure, a c-axis aligned crystalline oxide semiconductor (CAAC-OS) film is preferably used. When the oxide semiconductor film is a CAAC-OS film, the reliability of the transistor can be increased.

Note that a CAAC-OS film means an oxide semiconductor film including a crystal which has c-axis alignment and a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis varies in the a-b plane (or the surface, or at the interface) (the crystal rotates around the c-axis).

In a broad sense, the CAAC-OS film means a non-single-crystal oxide semiconductor film including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis.

The CAAC-OS film is not a single crystal, but this does not mean that the CAAC-OS film is composed of only an amorphous component. Although the CAAC-OS film includes a crystalline region (a crystal region), a boundary between one crystal region and another crystal region is not clear in some cases.

Nitrogen may be substituted for part of oxygen included in the CAAC-OS film. The c-axes of individual crystal region included in the CAAC-OS film may be aligned in one direction (e.g., a direction perpendicular to a surface of a substrate over which the CAAC-OS film is formed, or a surface, a film surface, or an interface of the CAAC-OS film). Alternatively, normals to the a-b planes of individual crystal regions included in the CAAC-OS film may be aligned in one direction (e.g., a direction perpendicular to the surface of the substrate, or the surface, the film surface, or the interface of the CAAC-OS film).

The CAAC-OS film may be a conductor, a semiconductor, or an insulator depending on its composition or the like. Further, the CAAC-OS film may transmit or not transmit visible light depending on its composition or the like.

As an example of such a CAAC-OS film, there is a material which is formed into a film shape and has a triangular or hexagonal atomic arrangement when observed from the direction perpendicular to a surface of the film or, a surface of a substrate, or an interface and in which metal atoms are arranged in a layered manner or metal atoms and oxygen atoms (or nitrogen atoms) are arranged in a layered manner when a cross section of the film is observed.

An example of a crystal structure included in the CAAC-OS film is described in detail. In the description below, in principle, the upward direction corresponds to the c-axis direction and a plane perpendicular to the c-axis direction corresponds to the a-b plane in FIGS. 6A to 6E, FIGS. 7A to 7C, and FIGS. 8A to 8C. When the expressions "an upper half" and "a lower half" are simply used, they refer to an upper half above the a-b plane and a lower half below the a-b plane. Furthermore, in FIGS. 6A to 6E, O surrounded by a circle represents a tetracoordinate O atom, and O surrounded by a double circle represents a tricoordinate O atom.

Figure 6A:
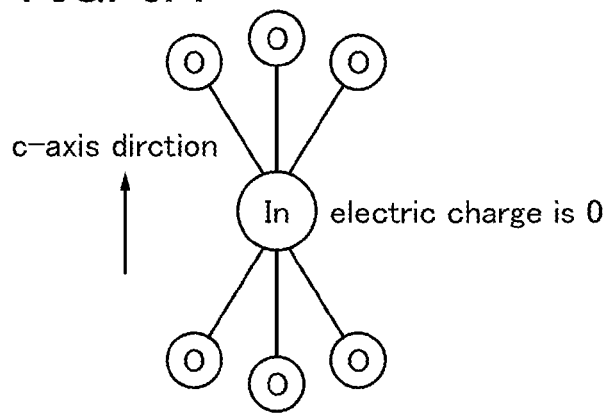
FIGS. 6A to 6E illustrate a structure of an oxide material according to one embodiment of the present invention.

FIG. 6A illustrates a structure including one hexacoordinate indium (hereinafter referred to as In) atom and six tetracoordinate oxygen (hereinafter referred to as tetracoordinate O) atoms proximate to the In atom. Here, a structure including one metal atom and oxygen atoms proximate thereto is referred to as small group. The structure in FIG. 6A is actually an octahedral structure, but is illustrated as a planar structure for simplicity. Note that three tetracoordinate O atoms exist in each of an upper half and a lower half in FIG. 6A. In the small group illustrated in FIG. 6A, electric charge is O (zero).

Figure 6D:
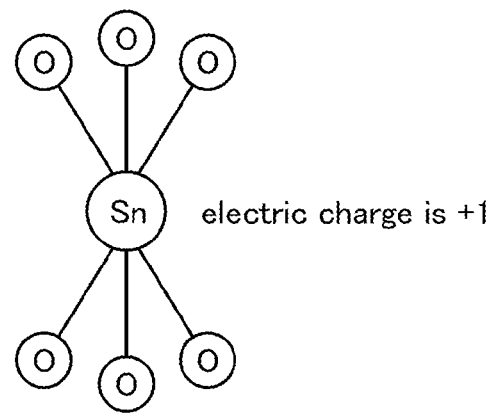
Figure 6B:
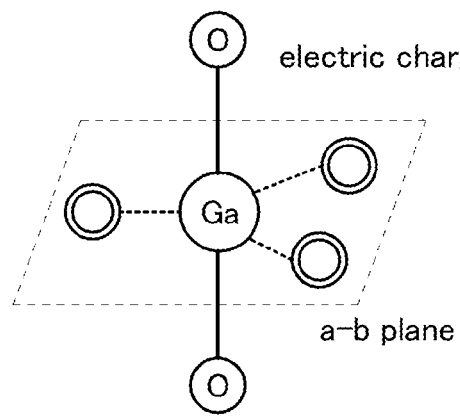

FIG. 6B illustrates a structure including one pentacoordinate gallium (hereinafter referred to as Ga) atom, three tricoordinate oxygen (hereinafter referred to as trico ordinate O) atoms proximate to the Ga atom, and two tetracoordinate O atoms proximate to the Ga atom (or near neighbor Ga atom). All the tricoordinate O atoms exist on the a-b plane. One tetracoordinate O atom exists in each of an upper half and a lower half in FIG. 6B. An In atom can also have the structure illustrated in FIG. 6B because an In atom can have five ligands. In the small group illustrated in FIG. 6B, electric charge is O.

Figure 6E:
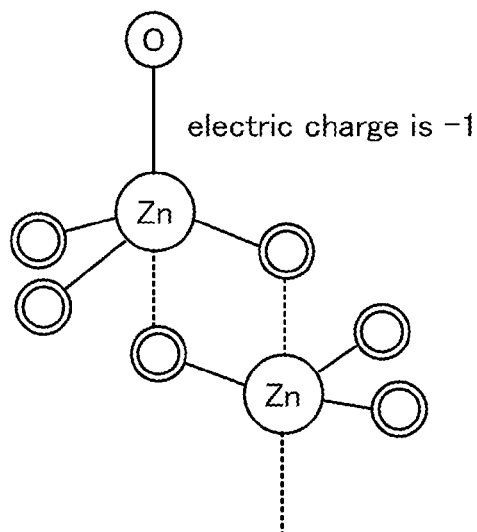
Figure 6C:
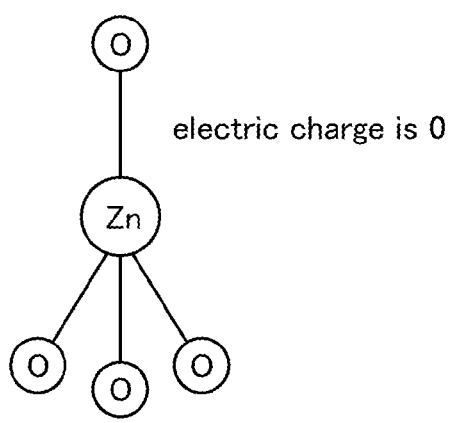

FIG. 6C illustrates a structure including one tetracoordinate zinc (hereinafter referred to as Zn) atom and four tetracoordinate O atoms proximate to the Zn atom. In FIG. 6C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 6C. In the small group illustrated in FIG. 6C, electric charge is 0.

FIG. 6D illustrates a structure including one hexacoordinate Sn atom and six tetracoordinate O atoms proximate to the Sn atom. In FIG. 6D, three tetracoordinate O atoms exist in each of an upper half and a lower half In the small group illustrated in FIG. 6D, electric charge is +1.

FIG. 6E illustrates a small group including two Zn atoms. In FIG. 6E, one tetracoordinate O atom exists in each of an upper half and a lower half In the small group illustrated in FIG. 6E, electric charge is −1.

Here, a plurality of small groups form a medium group, and a plurality of medium groups form a large group (also referred to as unit cell).

Now, a rule of bonding between the small groups is described. The three O atoms in the upper half with respect to the hexacoordinate In atom in FIG. 6A each have three proximate In atoms in the downward direction, and the three O atoms in the lower half each have three proximate In atoms in the upward direction. The one O atom in the upper half with respect to the pentacoordinate Ga atom in FIG. 6B has one proximate Ga atom in the downward direction, and the one O atom in the lower half has one proximate Ga atom in the upward direction. The one O atom in the upper half with respect to the tetracoordinate Zn atom in FIG. 6C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the total number of the proximate metal atoms below and above the O atom is 4. Accordingly, when the total number of tetracoordinate O atoms above a metal atom and below another metal atom is 4, the two kinds of small groups including the metal atoms can be bonded to each other. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 7A:
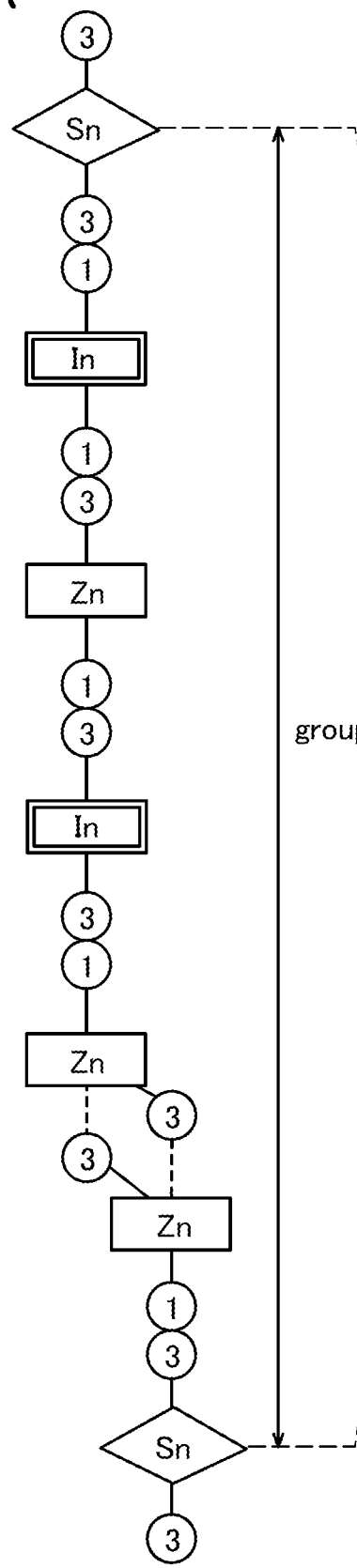
FIGS. 7A to 7C illustrate a structure of an oxide material according to one embodiment of the present invention.
Figure 7B:
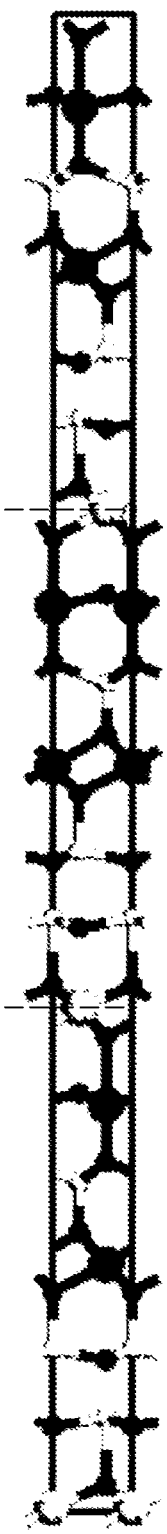
Figure 7C:
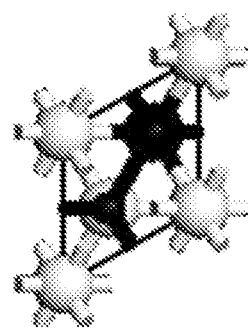

FIG. 7A illustrates a model of a medium group included in a layered structure of an In—Sn—Zn—O-based material. FIG. 7B illustrates a large group including three medium groups. Note that FIG. 7C illustrates an atomic arrangement in the case where the layered structure in FIG. 7B is observed from the c-axis direction.

In FIG. 7A, a tricoordinate O atom is omitted for simplicity, and a tetracoordinate O atom is illustrated by a circle; the number in the circle shows the number of tetracoordinate O atoms. For example, three tetracoordinate O existing in each of an upper half and a lower half with respect to a Sn atom are denoted by circled 3. Similarly, in FIG. 7A, one tetracoordinate O atom existing in each of an upper half and a lower half with respect to an In atom is denoted by circled 1. FIG. 7A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 7A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 6E can be given. For example, with one small group including two Zn atoms, electric charge of one small group including a Sn atom can be cancelled, so that the total electric charge of the layered structure can be 0.

Specifically, when the large group illustrated in FIG. 7B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: the above-described four-component metal oxides, three-component metal oxides, or two-component metal oxides.

Figure 8A:
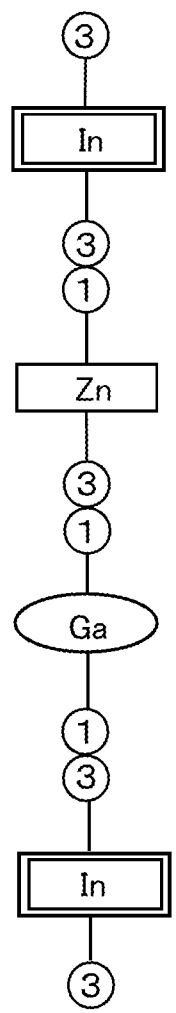
FIGS. 8A to 8C illustrate a structure of an oxide material according to one embodiment of the present invention.

FIG. 8A illustrates a model of a medium group included in a layered structure of an In—Ga—Zn-based metal oxide material.

In the medium group included in the layered structure of the In—Ga—Zn-based metal oxide material in FIG. 8A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 8B:
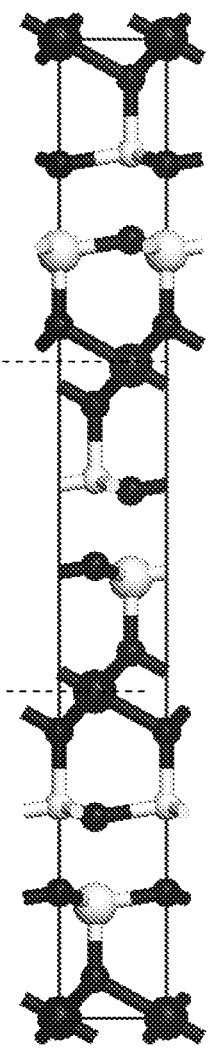
Figure 8C:
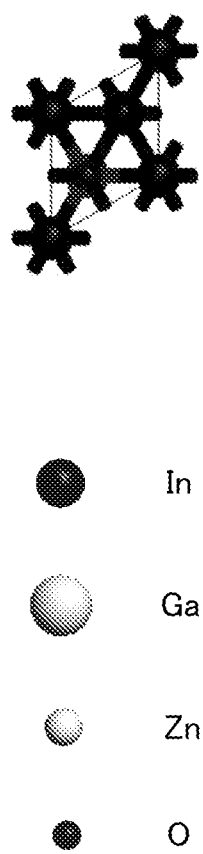

FIG. 8B illustrates a large group including three medium groups. Note that FIG. 8C illustrates an atomic arrangement in the case where the layered structure in FIG. 8B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based metal oxide material, a large group can be formed using not only the medium group illustrated in FIG. 8A but also a medium group in which the arrangement of the In atom, the Ga atom, and the Zn atom is different from that in FIG. 8A.

Here, a method for forming the CAAC-OS film is described.

First, an oxide semiconductor film is formed by a sputtering method, a molecular beam epitaxy method, an atomic layer deposition method, a pulsed laser deposition method, or the like. Note that by forming an oxide semiconductor film while keeping the semiconductor substrate 700 at high temperature, the ratio of a crystal region to an amorphous region can be high. At this time, the temperature of the semiconductor substrate 700 is, for example, higher than or equal to 150° C. and lower than or equal to 700° C., preferably higher than or equal to 150° C. and lower than or equal to 450° C., more preferably higher than or equal to 200° C. and lower than or equal to 350° C.

Here, the oxide semiconductor film formed may be subjected to a heat treatment. By the heat treatment, the ratio of the crystal region to the amorphous portion can be higher. In this heat treatment, the temperature applied to the semiconductor substrate 700 over which the p-channel and n-channel transistors are provided is, for example, higher than or equal to 200° C. and lower than a temperature at which the semiconductor substrate 700 over which the p-channel or n-channel transistor is formed is changed in quality or deformed, for example, higher than or equal to 150° C., preferably higher than or equal to 200° C., more preferably higher than or equal to 400° C. The heat treatment is performed for longer than or equal to 3 minutes, preferably for longer than or equal to 3 minutes and shorter than or equal to 24 hours. When the time for the heat treatment is increased, the ratio of the crystal region to the amorphous region can be made higher; however, the productivity is decreased. Note that the heat treatment may be performed in, without limitation, an oxidizing atmosphere or an inert atmosphere. This heat treatment may be performed under a reduced pressure.

The oxidizing atmosphere is an atmosphere containing an oxidizing gas. Examples of the oxidizing gas include oxygen, ozone, nitrous oxide, and the like. It is preferable that components (e.g., water and hydrogen) which are not preferably contained in the oxide semiconductor film be removed from the oxidizing atmosphere as much as possible. For example, the purity of oxygen, ozone, or nitrous oxide is higher than or equal to 8N (99.999999%), preferably higher than or equal to 9N (99.9999999%).

The oxidizing atmosphere may contain an inert gas such as a rare gas. Note that the oxidizing atmosphere contains an oxidizing gas at a concentration of higher than or equal to 10 ppm.

Note that an inert atmosphere contains an inert gas (e.g., a nitrogen gas or a rare gas) and contains a reactive gas such as an oxidizing gas at a concentration of less than 10 ppm.

Note that a rapid thermal anneal (RTA) apparatus may be used for all the heat treatments. With the use of the RTA apparatus, only in a short time, the heat treatments can be performed at higher temperature. Thus, the oxide semiconductor film can have a higher ratio of the crystal region to the amorphous region and the productivity can be prevented from decreasing.

However, the apparatus used for all the heat treatments is not limited to the RTA apparatus; for example, an apparatus provided with a unit that heats an object to be processed by thermal conduction or thermal radiation from a resistance heater or the like is used. Examples of the heat treatment apparatus used for all the heat treatments include an electric furnace and a rapid thermal anneal (RTA) apparatus such as a gas rapid thermal anneal (GRTA) apparatus or a lamp rapid thermal anneal (LRTA) apparatus. An LRTA apparatus is an apparatus for heating an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed using a high-temperature gas as a heat medium. Here, the temperature of the high-temperature gas is preferably higher than the heat temperature of the object to be processed.

With the use of an In—Ga—Zn-based metal oxide in which the nitrogen concentration is $1\times10^{17}$ atoms/cm$^3$ to $5\times10^{19}$ atoms/cm$^3$, a metal oxide film having a c-axis-aligned hexagonal crystal structure is formed and one or more layers containing Ga and Zn are provided between two layers of the In—O crystal planes (crystal planes containing indium and oxygen).

The CAAC-OS film can be formed in the above manner.

The CAAC-OS film has high orderliness of a bond between metal and oxygen as compared to an oxide semiconductor film having an amorphous structure. In other words, in an oxide semiconductor film having an amorphous structure, the number of oxygen atoms coordinating to a metal atom may vary according to the kind of an adjacent metal, whereas in the CAAC-OS film, the number of oxygen atoms coordinating to a metal atom is substantially equal. Therefore, oxygen vacancy is hardly observed even at a microscopic level, and charge transfer and instability of electric conductivity due to hydrogen atoms (including hydrogen ions), alkali metal atoms, or the like can be prevented.

Therefore, a transistor is formed using the CAAC-OS film for a channel formation region, whereby the amount of change in the threshold voltage of the transistor between before and after light irradiation or a bias-temperature stress (BT) test performed on the transistor can be suppressed, and the transistor can have stable electric characteristics.

Figure 5A:
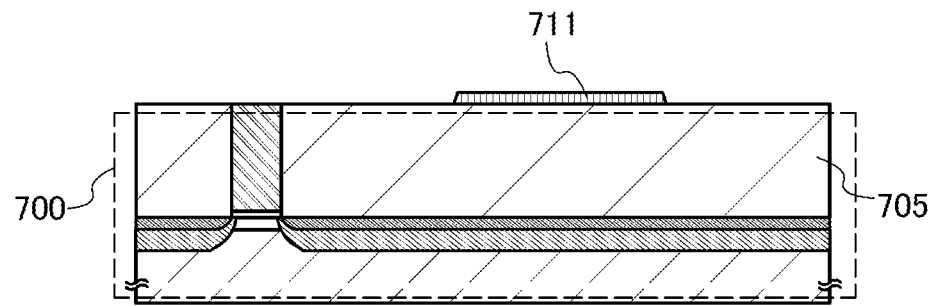
FIGS. 5A to 5D are cross-sectional views illustrating a method for manufacturing a transistor according to one embodiment of the present invention.

Next, an etching mask is formed over the oxide semiconductor film and etching is performed, so that the oxide semiconductor layer 711 is formed (see FIG. 5A).

Figure 5B:
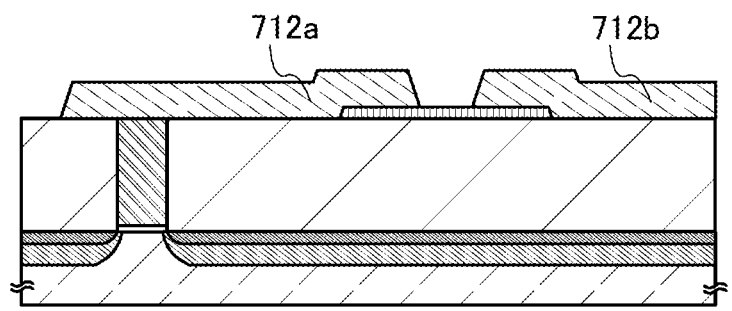

Then, the source electrode 712a and the drain electrode 712b are formed separately from each other and in contact with the oxide semiconductor layer 711 (see FIG. 5B).

The source electrode 712a and the drain electrode 712b is selectively formed in a manner such that, for example, a conductive film (e.g., a metal film or a silicon film to which an impurity element imparting one conductivity type is added) is formed by a sputtering method, an etching mask is formed over the conductive film, and etching is performed. Alternatively, an inkjet method may be used. Note that the conductive film to be the source electrode 712a and the drain electrode 712b may be formed with a single layer or a plurality of stacked layers. For example, the conductive film may have a three-layer structure in which an Al layer is sandwiched between Ti layers. Note that the source electrode 712a and the drain electrode 712b also serve as signal lines.

Figure 5C:
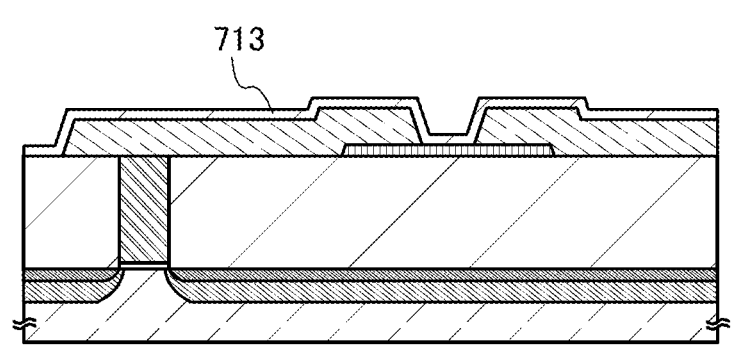

Next, the gate insulating film 713 is formed over at least the channel formation region of the oxide semiconductor layer 711 (see FIG. 5C).

The gate insulating film 713 is formed by, for example, a sputtering method using an insulating material (e.g., silicon nitride, silicon nitride oxide, silicon oxynitride, or silicon oxide). Note that the gate insulating film 713 may be formed with a single layer or a plurality of stacked layers. Here, for example, a layered structure of two layers in which a silicon oxynitride layer is stacked over a silicon nitride layer is employed. Note that in the case where the gate insulating film 713 is formed by a sputtering method, hydrogen and water can be prevented from entering the oxide semiconductor layer 711. Further, the gate insulating film 713 is preferably an insulating oxide film because oxygen can be supplied to compensate for oxygen vacancies.

Note that "silicon nitride oxide" contains more nitrogen than oxygen. Further, "silicon oxynitride" contains more oxygen than nitrogen.

The oxide semiconductor film may be processed by dry etching. For example, a chlorine gas or a mixed gas of a boron trichloride gas and a chlorine gas may be used as an etching gas used for the dry etching. However, there is no limitation thereto; wet etching may be used or another method capable of processing the oxide semiconductor film may be used.

The gate insulating film 713 contains oxygen at least in a portion in contact with the oxide semiconductor layer 711 and is preferably formed using an insulating oxide in which part of the oxygen is desorbed by a heat treatment. In other words, any of the materials given as the material of the interlayer insulating film 705 is preferably used. When the portion of the gate insulating film 713, which is in contact with the oxide semiconductor layer 711, is formed using silicon oxide, oxygen can be supplied to the oxide semiconductor layer 711 and reduction in the resistance of the transistor can be prevented.

Note that when the gate insulating film 713 is formed using a high-k material such as hafnium silicate (HfSiO$_x$ (x>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), hafnium oxide, yttrium oxide, or lanthanum oxide, gate leakage current can be reduced. Here, the gate leakage current refers to leakage current which flows between a gate electrode and a source or drain electrode. Further, a layer formed using the high-k material and a layer formed using any of silicon oxide, silicon oxynitride, silicon nitride, silicon nitride oxide, aluminum oxide, aluminum oxynitride, and gallium oxide may be stacked. Note that even when the gate insulating film 713 has a layered structure, the portion in contact with the oxide semiconductor layer 711 is preferably formed using the above insulating oxide. Further, in order not to release oxygen from the oxide semiconductor layer 711, aluminum oxide or the like which hardly permeate oxygen is preferably formed over the insulating oxide. For example, as the gate insulating film 713, silicon oxide deposited by a sputtering method, aluminum oxide deposited by a sputtering method, and silicon oxynitride is stacked in this order.

The thickness of the gate insulating film 713 is greater than or equal to 1 nm and less than or equal to 300 nm, preferably greater than or equal to 5 nm and less than or equal to 50 nm. When the thickness of the gate insulating film 713 is greater than or equal to 5 nm, the gate leakage current can be particularly reduced.

Here, a third heat treatment (preferably a temperature higher than or equal to 200° C. and lower than or equal to 400° C., for example, higher than or equal to 250° C. and lower than or equal to 350° C.) may be further performed in an inert gas atmosphere or an oxygen gas atmosphere. Note that the third heat treatment can be performed under the same conditions as the second heat treatment, for example, at higher than or equal to 200° C. and lower than the strain point of the semiconductor substrate 700, preferably higher than or equal to 200° C. and lower than or equal to 400° C., more preferably higher than or equal to 250° C. and lower than or equal to 350° C. Hydrogen and water remaining in the oxide semiconductor layer 711 can be diffused into the gate insulating film 713 by the third heat treatment. Further, oxygen can be supplied to the oxide semiconductor layer 711 by the third heat treatment in which the gate insulating film 713 serves as a supply source.

The third heat treatment can be performed not only after the formation of the gate insulating film 713 over the oxide semiconductor layer 711 but also after the formation of the conductive film to be the gate electrode 714.

Here, the hydrogen concentration in the oxide semiconductor layer 711 is lower than or equal to $5.0 \times 10^{19}$ atoms/cm$^3$, preferably lower than or equal to $5.0 \times 10^{18}$ atoms/cm$^3$.

Figure 5D:
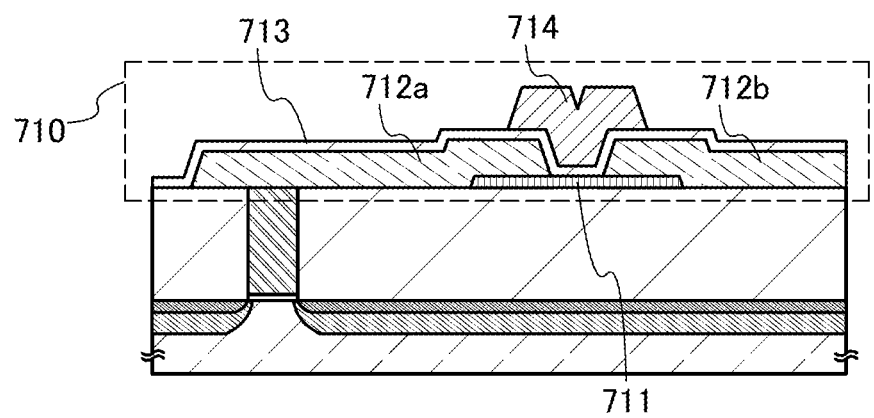

Next, a conductive film is formed over the gate insulating film 713, an etching mask is formed over the conductive film, and etching is performed, so that the gate electrode 714 is formed (see FIG. 5D). Note that the gate electrode 714 serves at least as a scan line.

The gate electrode 714 is formed using the same material and method as the source electrode 712a and the drain electrode 712b.

Although not illustrated, dopant is preferably added to the oxide semiconductor layer 711 by using the gate electrode 714 as a mask, so that a source region and a drain region are formed in the oxide semiconductor layer 711. Note that, here, the dopant may be added by an ion implantation method or an ion doping method. Alternatively, the dopant may be added by performing a plasma treatment in an atmosphere of a gas containing the dopant. As the added dopant, nitrogen, phosphorus, boron, or the like is used.

In the case where the etching mask is formed using a resist material, the etching mask may be removed by ashing in formation of the transistor 710 illustrated in FIG. 5D.

Although not illustrated, a protective insulating film may be formed to cover the transistor 710. When the protective insulating film is a single layer, an insulating film that hardly permeates oxygen, hydrogen, and water, such as an aluminum oxide film, is formed. When the protective insulating film is a stacked layer, an insulating oxide film in which the oxygen proportion is higher than that in the stoichiometric composition ratio and which releases part of the oxygen by a heat treatment and an insulating film that hardly permeates oxygen, hydrogen, and water are preferably formed. For example, a stack of the insulating oxide film exemplified for the interlayer insulating film 705 and an aluminum oxide film is formed. Note that by using the aluminum oxide film as the protective insulating film, oxygen in the oxide semiconductor layer 711 can be prevented from being released outside and hydrogen and water can be prevented from entering from the outside to the oxide semiconductor layer 711; thus, the electric characteristics of the transistor 710 can be made favorable.

After the protective insulating film is formed, a heat treatment similar to the second or third heat treatment may be performed.

In the above manner, the transistor whose channel formation region is formed in the oxide semiconductor layer can be formed over the transistor provided over the semiconductor substrate, which is illustrated in FIG. 4.

The transistor formed in the above manner can have an off-state current value per micrometer of a channel width, which is lower than or equal to 10 aA ($1\times10^{-17}$ A), 1 aA ($1\times10^{-18}$ A), 1 zA ($1\times10^{-21}$ A), or 1 yA ($1\times10^{-24}$ A) at room temperature.

In either or both the scan line and the signal line, copper is preferably used to form a conductive layer for forming the scan line and the signal line because the wiring can have lower resistance.

Further, the transistor described as the transistor whose channel formation region is formed in the oxide semiconductor layer is an example; therefore, a transistor whose channel formation region is formed in an oxide semiconductor layer can have a variety of modes without limitation to the above transistor.

An example of a transistor in which an In—Sn—Zn-based metal oxide film (hereinafter referred to as an In—Sn—Zn—O film) is used for an oxide semiconductor film will be described with reference to FIGS. 20A and 20B and the like.

Figure 20A:
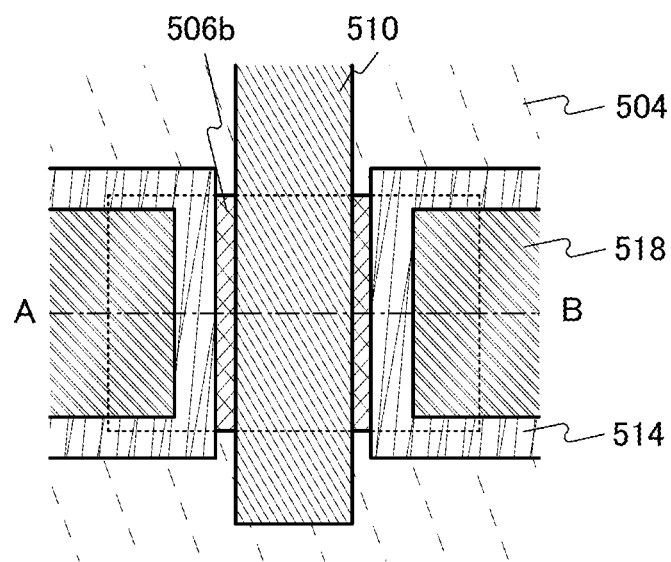
FIGS. 20A and 20B are a top view and a cross-sectional view illustrating a transistor according to one embodiment of the present invention.
Figure 20B:
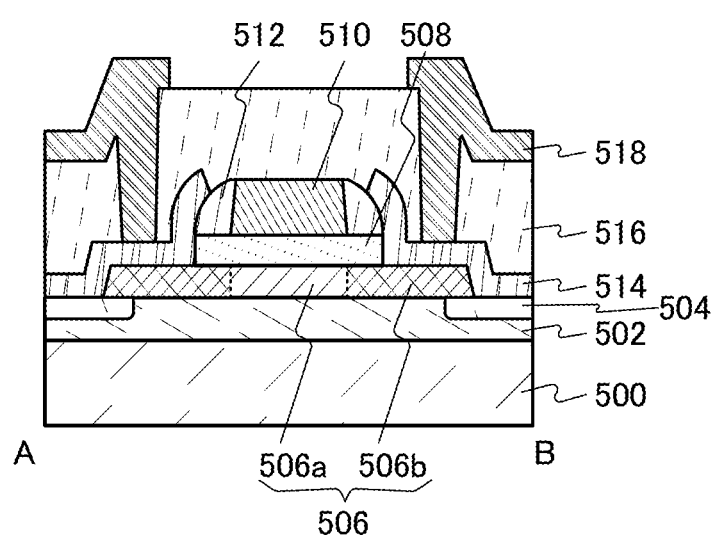

FIGS. 20A and 20B are a top view and a cross-sectional view of a coplanar transistor having a top-gate top-contact structure. FIG. 20A is the top view of the transistor. FIG. 20B illustrates a cross section A-B taken along the dashed-dotted line A-B in FIG. 20A.

The transistor illustrated in FIG. 20B includes a substrate 500; a base insulating film 502 provided over the substrate 500; a protective insulating film 504 provided in the periphery of the base insulating film 502; an oxide semiconductor film 506 which is provided over the base insulating film 502 and the protective insulating film 504 and which includes a high-resistance region 506a and low-resistance regions 506b; a gate insulating film 508 provided over the oxide semiconductor film 506; a gate electrode 510 provided to overlap with the oxide semiconductor film 506 with the gate insulating film 508 provided therebetween; a sidewall insulating film 512 provided in contact with a side surface of the gate electrode 510; a pair of electrodes 514 provided in contact with at least the low-resistance regions 506b; an interlayer insulating film 516 provided to cover at least the oxide semiconductor film 506, the gate electrode 510, and the pair of electrodes 514; and a wiring 518 provided to be connected to at least one of the pair of electrodes 514 through an opening formed in the interlayer insulating film 516.

The substrate 500 corresponds to the semiconductor substrate 700. The base insulating film 502 corresponding to the interlayer insulating film 705 is formed using a silicon oxide film. The oxide semiconductor film 506 corresponding to the oxide semiconductor layer 711 is formed using an In—Sn—Zn—O film. The pair of electrodes 514 corresponding to the source electrode 712a and the drain electrode 712b is formed using a tungsten film. The gate insulating film 508 corresponding to the gate insulating film 713 is formed using a silicon oxide film. The gate electrode 510 corresponding to the gate electrode 714 has a layered structure of a tantalum nitride film and a tungsten film. The interlayer insulating film 516 has a layered structure of a silicon oxynitride film and a polyimide film. The wirings 518 each have a layered structure in which a titanium film, an aluminum film, and a titanium film are formed in this order. For the method for manufacturing the transistor, the description of this embodiment can be referred to, as appropriate.

Although not illustrated, a protective film may be provided to cover the interlayer insulating film 516 and the wiring 518. With the protective film, a minute amount of leakage current generated by surface conduction of the interlayer insulating film 516 can be reduced; thus, the off-state current of the transistor can be reduced.

Further, another example of a transistor in which an In—Sn—Zn—O film which is different from that of the above is used as an oxide semiconductor film will be described.

Figure 21A:
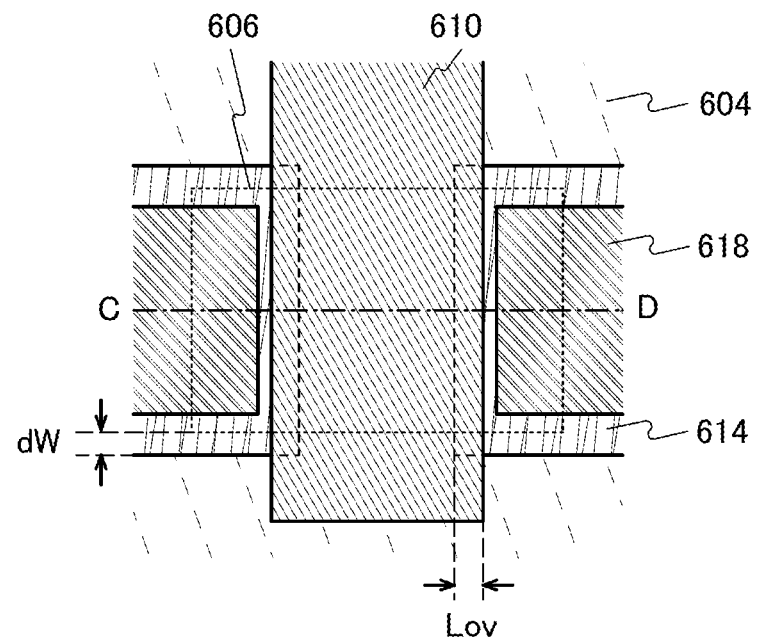
FIGS. 21A and 21B are a top view and a cross-sectional view illustrating a transistor according to one embodiment of the present invention.
Figure 21B:
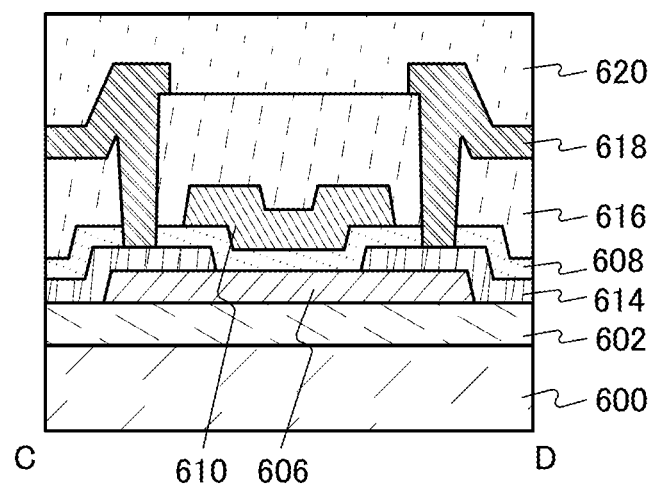

FIGS. 21A and 21B are a top view and a cross-sectional view which illustrates a structure of a transistor formed in this embodiment. FIG. 21A is the top view of the transistor. FIG. 21B illustrates a cross section C-D taken along the dashed-dotted line C-D in FIG. 21A.

The transistor illustrated in FIG. 21B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 provided therebetween; an interlayer insulating film 616 provided to cover the gate insulating film 608 and the gate electrode 610; wirings 618 connected to the pair of electrodes 614 through openings formed in the interlayer insulating film 616; and a protective film 620 provided to cover the interlayer insulating film 616 and the wirings 618. For the method for manufacturing the transistor, the description of this embodiment can be referred to, as appropriate.

The substrate 600 corresponds to the semiconductor substrate 700. The base insulating film 602 corresponding to the interlayer insulating film 705 is formed using a silicon oxide film. The oxide semiconductor film 606 corresponding to the oxide semiconductor layer 711 is formed using an In—Sn—Zn—O film. The pair of electrodes 614 corresponding to the source electrode 712a and the drain electrode 712b is formed using a tungsten film. The gate insulating film 608 corresponding to the gate insulating film 713 is formed using a silicon oxide film. The gate electrode 610 corresponding to the gate electrode 714 has a layered structure of a tantalum nitride film and a tungsten film. The interlayer insulating film 616 has a layered structure of a silicon oxynitride film and a polyimide film. The wirings 618 each have a layered structure in which a titanium film, an aluminum film, and a titanium film are formed in this order. The protective film 620 is formed using a polyimide film.

Note that in the transistor having the structure illustrated in FIG. 21A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

The actually measured field-effect mobility of an insulated gate transistor which can be used for a transistor included in a semiconductor device according to one embodiment of the present invention can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the field-effect mobility $\mu$ can be expressed as the following formula (3). Here, E represents the height of the potential barrier, k represents the Boltzmann constant, and T represents the absolute temperature.

[FORMULA 4]

$$\mu = \mu_0 \exp\left(-\frac{E}{kT}\right) \quad (3)$$

When the potential barrier is assumed to be attributed to a defect, the height of the potential barrier E can be expressed as the following formula (4) according to the Levinson model.

[FORMULA 5]

$$E = \frac{e^2 N^2}{8\varepsilon n} = \frac{e^3 N^2 t}{8\varepsilon C_{ox} V_g} \quad (4)$$

Here, e represents the elementary charge, N represents the average defect density per unit area in a channel, $\varepsilon$ represents the permittivity of the semiconductor, n represents carrier surface density of the channel, $C_{ox}$ represents the capacitance per unit area, $V_g$ (a potential difference between the gate and the source) represents the gate voltage, and t represents the thickness of the channel.

In the case where the thickness of the semiconductor layer used in the insulated gate transistor is less than or equal to 30 nm, the thickness of the channel formation region may be regarded as being the same as the thickness of the semiconductor layer. The drain current $I_d$ in a linear region can be expressed as the following formula (5). Note that a current that flows between a source and a drain when $V_g$ is higher than the threshold voltage of the transistor is called a drain current.

[FORMULA 6]

$$I_d = \frac{W \mu V_g V_d C_{ox}}{L} \exp\left(-\frac{E}{kT}\right) \quad (5)$$

Here, L represents the channel length and W represents the channel width, and L and W are each 10 μm. In addition, $V_d$ represents the drain voltage. When dividing both sides of the above equation by $V_g$ and then taking logarithms of both sides, the following formula (6) can be obtained.

[FORMULA 7]

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8 k T \varepsilon C_{ox} V_g} \quad (6)$$

The right side of Formula 6 is a function of $V_g$. From the Formula 6, it is found that the defect density N can be obtained from the slope of a line with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 $cm^2/Vs$ from Formula 3 and Formula 4. The measured field-effect mobility of an In—Sn—Zn-based metal oxide including a defect is approximately 40 $cm^2/Vs$. However, assuming that no defect exists inside the semiconductor and at the interface between the semiconductor and an insulating film, the field-effect mobility $\mu_0$ of the oxide semiconductor is expected to be 120 $cm^2/Vs$.

Note that even when no defect exists inside an oxide semiconductor film, scattering at an interface between a channel formation region and a gate insulating film affects the transport property of the transistor. In other words, the field-effect mobility $\mu_1$ at a position that is distance x away from the interface between the channel formation region and the gate insulating film can be expressed by Formula 7.

[FORMULA 7]

$$\frac{1}{\mu_1} = \frac{1}{\mu_0} + \frac{D}{B} \exp\left(-\frac{x}{l}\right) \quad (7)$$

Here, D represents the electric field in the gate direction, and B and l are constants. B and l can be obtained from actual measurement results, and according to the above measurement results, B is $4.75 \times 10^7$ cm/s and l is 10 nm (the depth to which the influence of interface scattering reaches). When D is increased (i.e., when the gate voltage is increased), the second term of Formula 7 is increased, so that the mobility $\mu_1$ is decreased.

Figure 9:
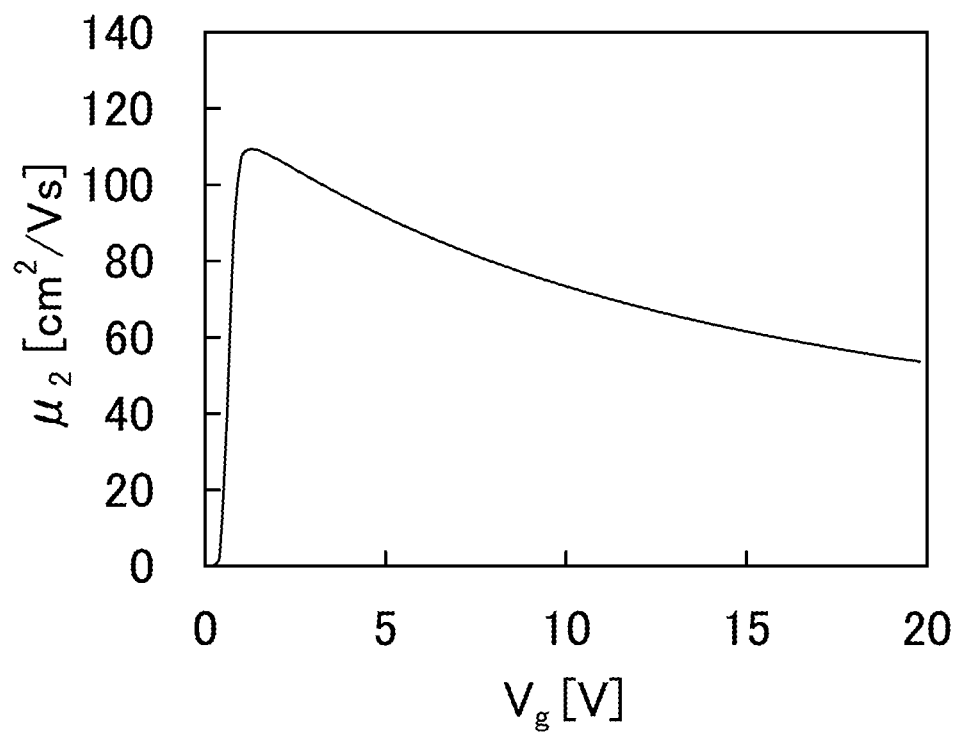
FIG. 9 shows calculation results of the gate voltage dependence of field-effect mobility in a transistor including an oxide semiconductor.

Calculation results of the field-effect mobility $\mu_2$ of a transistor having a channel formation region including an ideal oxide semiconductor without a defect inside are shown in FIG. 9. For the calculation, device simulation software Sentaurus Device manufactured by Synopsys, Inc. was used, and the band gap, the electron affinity, the relative permittivity, and the thickness of the oxide semiconductor were assumed to be 3.1 eV, 4.6 eV, 15, and 30 nm, respectively. Further, the work functions of a gate electrode, a source electrode, and a drain electrode were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 9, the field-effect mobility has a peak of 100 $cm^2/Vs$ or more at a gate voltage that is a little over 1 V and is decreased as the gate voltage becomes higher because the influence of interface scattering is increased. Note that in order to reduce interface scattering, it is preferable that a surface of the oxide semiconductor layer be flat at the atomic level (atomic layer flatness).

Calculation results of electric characteristics of minute transistors formed using an oxide semiconductor having such a field-effect mobility are shown in FIGS. 10A to 10C, FIGS. 11A to 11C, and FIGS. 12A to 12C. FIGS. 13A and 13B illustrate cross-sectional structures of the transistors used for the calculation. The transistors illustrated in FIGS. 13A and 13B each include a semiconductor region 1030a and a semiconductor region 1030c which have n⁺-type conductivity in an oxide semiconductor layer. The resistivity of the semiconductor region 1030a and the resistivity of the semiconductor region 1030c are each $2 \times 10^{-3}$ Ωcm.

The transistor in FIG. 13A is formed over a base insulator 1010 and an embedded insulator 1020 that is embedded in the base insulating insulator 1010 and formed of aluminum oxide. The transistor includes the semiconductor region 1030a, the semiconductor region 1030c, an intrinsic semiconductor region 1030*b* that is placed between the semiconductor regions 1030*a* and 1030*c* and serves as a channel formation region, and a gate electrode 1050. The width of the gate electrode 1050 is 33 nm.

A gate insulator 1040 is formed between the gate electrode 1050 and the semiconductor region 1030*b*. A sidewall insulator 1060*a* and a sidewall insulator 1060*b* are formed on both side surfaces of the gate electrode 1050, and an insulator 1070 is formed over the gate electrode 1050 to prevent a short circuit between the gate electrode 1050 and another wiring. The sidewall insulator has a width of 5 nm. A source electrode 1080*a* and a drain electrode 1080*b* are provided in contact with the semiconductor region 1030*a* and the semiconductor region 1030*c*, respectively. Note that the channel width of this transistor is 40 nm.

The transistor of FIG. 13B is the same as the transistor of FIG. 13A in that it is formed over the base insulator 1010 and the embedded insulator 1020 formed of aluminum oxide and that it includes the semiconductor region 1030*a*, the semiconductor region 1030*c*, the intrinsic semiconductor region 1030*b* provided therebetween, the gate electrode 1050 having a width of 33 nm, the gate insulator 1040, the sidewall insulator 1060*a*, the sidewall insulator 1060*b*, the insulator 1070, the source electrode 1080*a*, and the drain electrode 1080*b*.

The transistor illustrated in FIG. 13A is different from the transistor illustrated in FIG. 13B in the conductivity type of semiconductor regions under the sidewall insulator 1060*a* and the sidewall insulator 1060*b*. In the transistor illustrated in FIG. 13A, the semiconductor regions under the sidewall insulator 1060*a* and the sidewall insulator 1060*b* are part of the semiconductor region 1030*a* having $n^+$-type conductivity and part of the semiconductor region 1030*c* having $n^+$-type conductivity, whereas in the transistor illustrated in FIG. 13B, the semiconductor regions under the sidewall insulating layer 1060*a* and the sidewall insulating layer 1060*b* are part of the intrinsic semiconductor region 1030*b*. In other words, in the semiconductor layer of FIG. 13B, a region having a width of $L_{off}$ which overlaps with neither the semiconductor region 1030*a* (the semiconductor region 1030*c*) nor the gate electrode 1050 is provided. This region is called offset region, and the width $L_{off}$ is called offset length. As is seen from the drawing, the offset length is equal to the width of the sidewall insulator 1060*a* (the sidewall insulator 1060*b*).

Figure 10A:
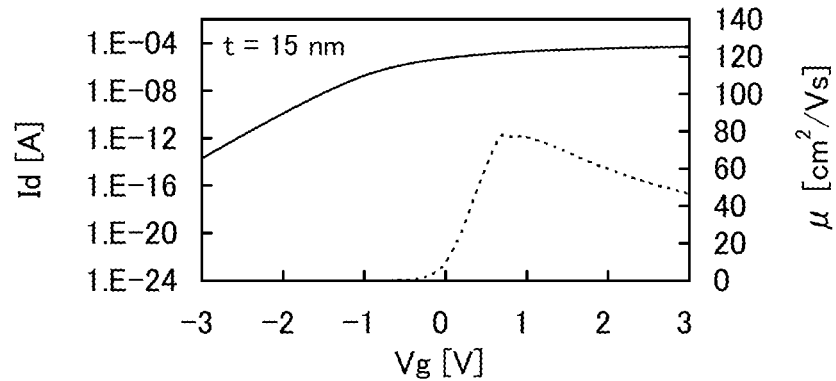
FIGS. 10A to 10C show calculation results of the gate voltage dependence of drain current and field-effect mobility in a transistor including an oxide semiconductor.
Figure 10B:
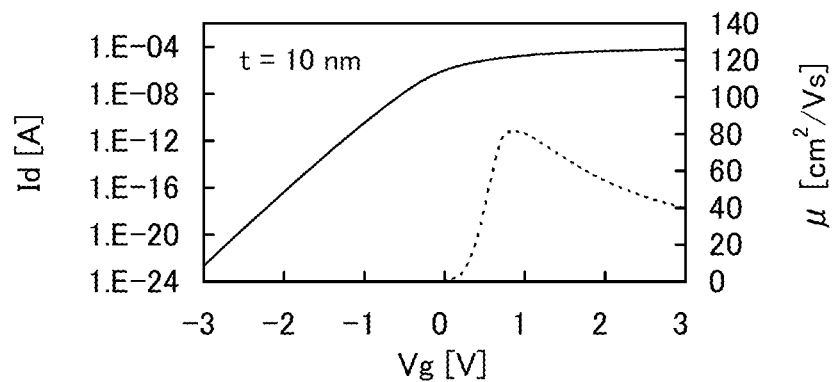
Figure 10C:
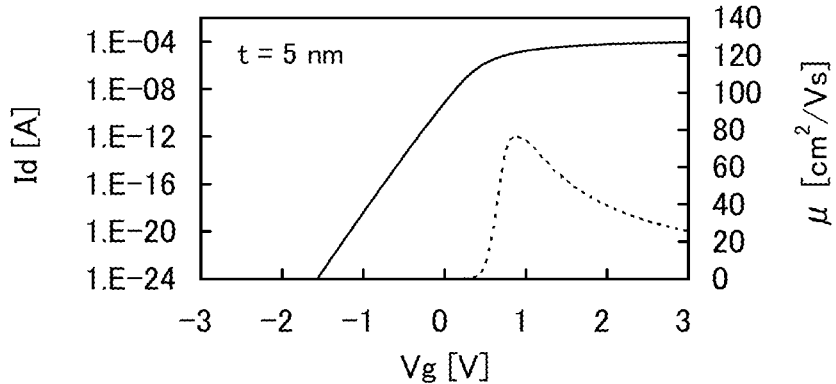

The other parameters used in calculation are as described above. For the calculation, the same device simulation software manufactured by Synopsys, Inc. was used. FIGS. 10A to 10C show the gate voltage $V_g$ (potential difference between the gate and the source) dependence of the drain current $I_d$ (solid line) and the field-effect mobility μ (dotted line) of the transistor having the structure illustrated in FIG. 13A. The drain current $I_d$ is obtained by calculation under the assumption that the drain voltage (potential difference between the drain and the source) is +1 V and the field-effect mobility μ is obtained by calculation under the assumption that the drain voltage is +0.1 V.

FIG. 10A shows the gate voltage $V_g$ dependence of the transistor in the case where the thickness of the gate insulator is 15 nm, FIG. 10B shows that of the transistor in the case where the thickness of the gate insulator is 10 nm, and FIG. 10C shows that of the transistor in the case where the thickness of the gate insulator is 5 nm. As the gate insulator is thinner, particularly, the drain current $I_d$ in an off state (off-state current) is significantly decreased. In contrast, there is no noticeable change in the peak value of the field-effect mobility μ and the drain current $I_d$ in an on state (on current). The graphs show that the drain current exceeds 10 μA at a gate voltage of around 1 V.

Figure 11A:
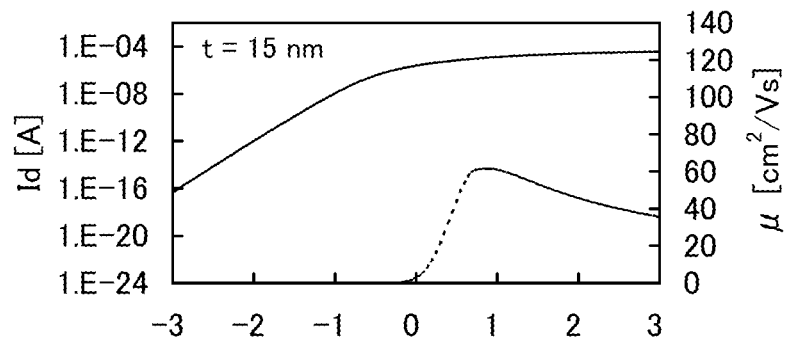
FIGS. 11A to 11C show calculation results of the gate voltage dependence of drain current and field-effect mobility in a transistor including an oxide semiconductor.
Figure 11B:
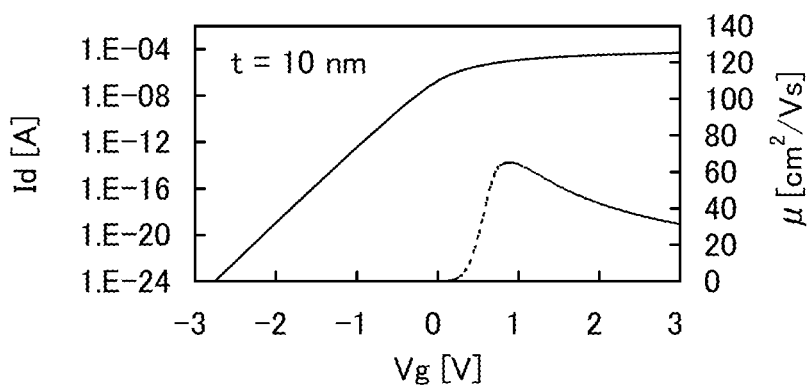
Figure 11C:
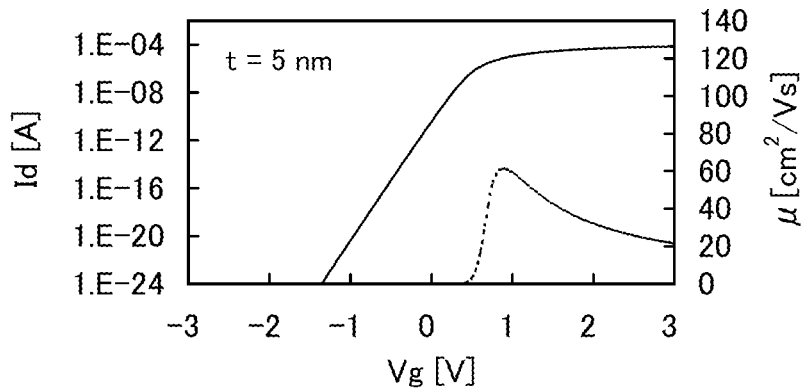

Further, FIGS. 11A to 11C show the gate voltage $V_g$ dependence of the drain current $I_d$ (solid line) and the field-effect mobility μ (dotted line) of the transistor having the structure illustrated in FIG. 13B where the offset length $L_{off}$ is 5 nm. The drain current $I_d$ is obtained by calculation under the assumption that the drain voltage is +1 V and the field-effect mobility μ is obtained by calculation under the assumption that the drain voltage is +0.1 V. FIG. 11A shows the gate voltage dependence $V_g$ of the transistor in the case where the thickness of the gate insulator is 15 nm, FIG. 11B shows that of the transistor in the case where the thickness of the gate insulator is 10 nm, and FIG. 11C shows that of the transistor in the case where the thickness of the gate insulator is 5 nm.

Figure 12A:
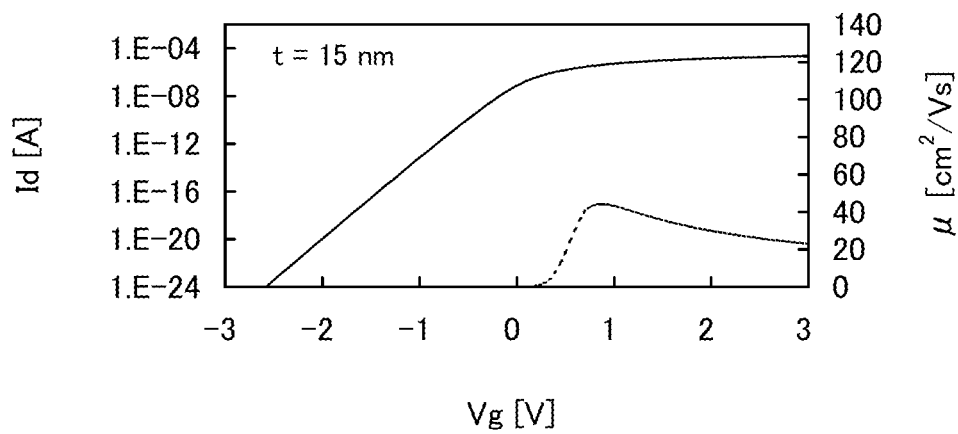
FIGS. 12A to 12C show calculation results of the gate voltage dependence of drain current and field-effect mobility in a transistor including an oxide semiconductor.
Figure 12B:
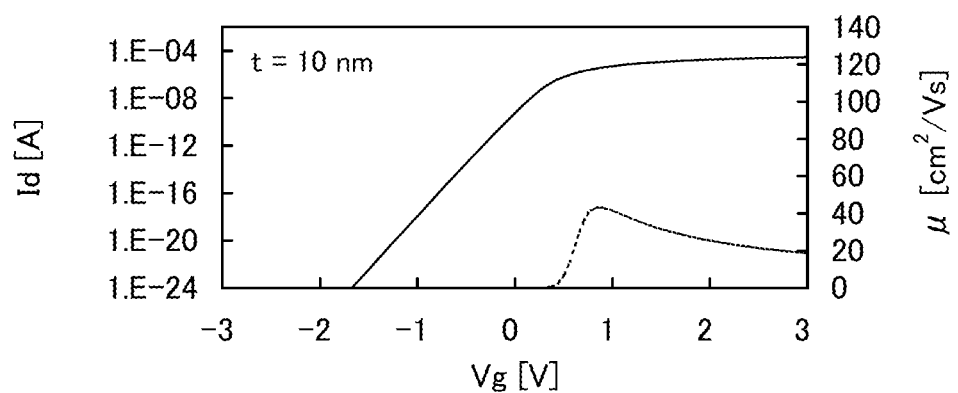
Figure 12C:
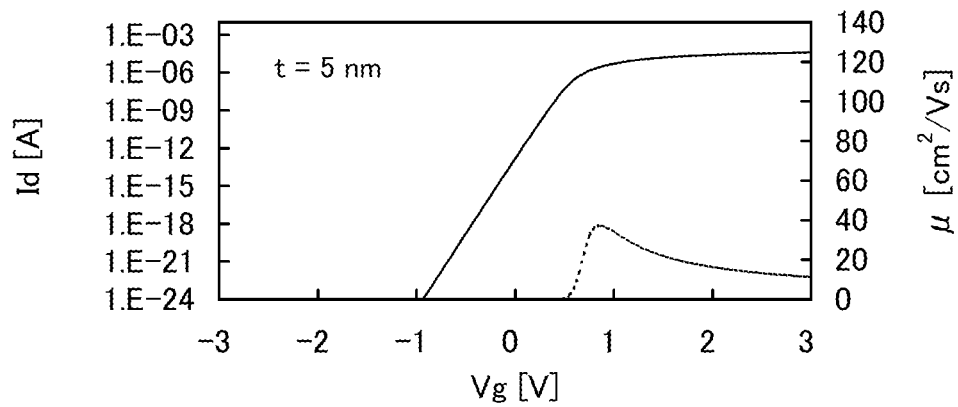
Figure 13A:
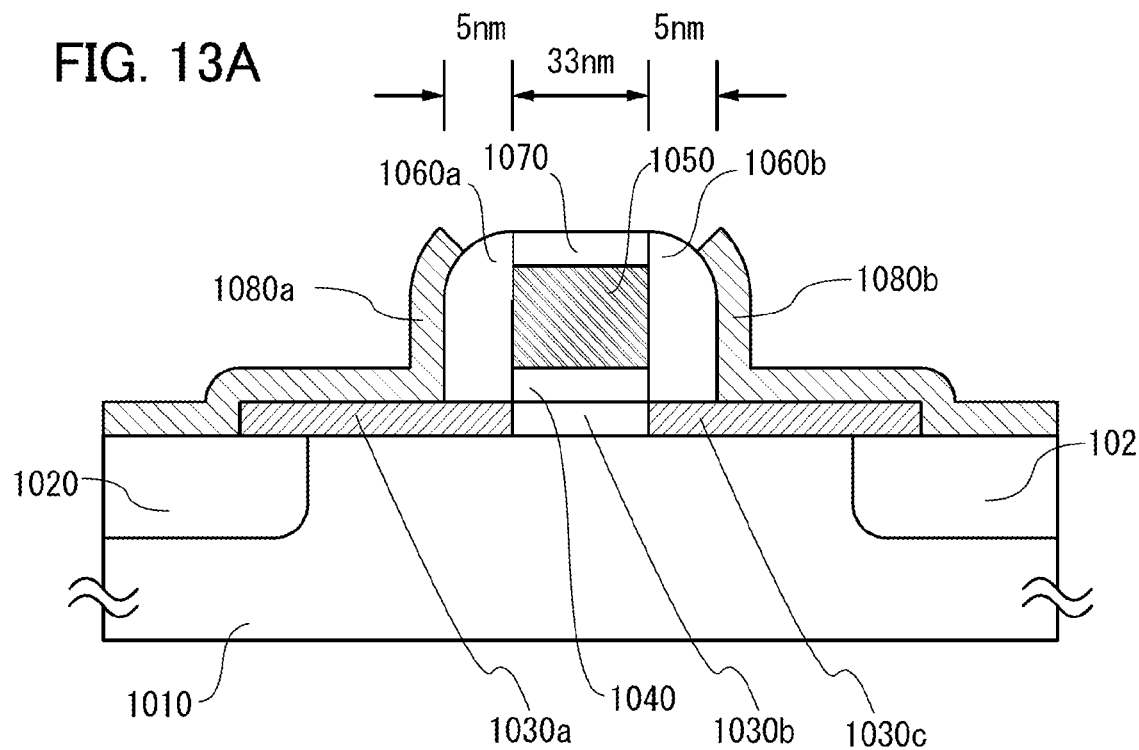
FIGS. 13A and 13B illustrate cross-sectional structures of transistors used for calculation.
Figure 13B:
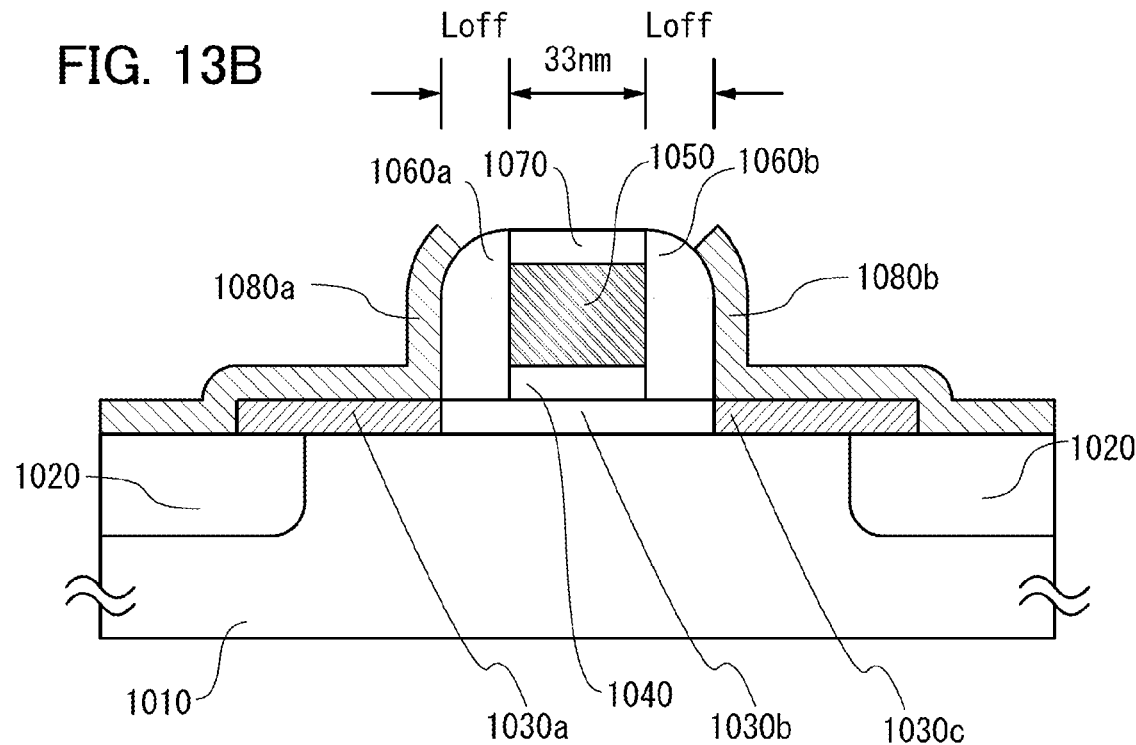

Furthermore, FIGS. 12A to 12C show the gate voltage $V_g$ dependence of the drain current $I_d$ (solid line) and the field-effect mobility μ (dotted line) of the transistor having the structure illustrated in FIG. 13B where the offset length $L_{off}$ is 15 nm. The drain current $I_d$ is obtained by calculation under the assumption that the drain voltage is +1 V and the field-effect mobility μ is obtained by calculation under the assumption that the drain voltage is +0.1 V. FIG. 12A shows the gate voltage $V_g$ dependence of the transistor in the case where the thickness of the gate insulator is 15 nm, FIG. 12B shows that of the transistor in the case where the thickness of the gate insulator is 10 nm, and FIG. 12C shows that of the transistor in the case where the thickness of the gate insulator is 5 nm.

In either of the structures, as the gate insulator is thinner, the off-state current is significantly decreased, whereas no noticeable change arises in the peak value of the field-effect mobility μ and the on-state current.

Note that the peak of the field-effect mobility μ is approximately 80 cm²V·s in FIGS. 10A to 10C, approximately 60 cm²/V·s in FIGS. 11A to 11C, and approximately 40 cm²/V·s in FIGS. 12A to 12C; thus, the peak of the mobility μ is decreased as the offset length $L_{off}$ is increased. Further, the same applies to the off-state current. The on current is also decreased as the offset length $L_{off}$ is increased; however, the decrease in the on current is much more gradual than the decrease in the off-state current. Further, the graphs show that in either of the structures, the drain current exceeds 10 μA at a gate voltage of around 1 V.

Next, among the transistors described in this embodiment, a transistor whose channel formation region is formed in an oxide semiconductor layer containing In, Sn, and Zn as main components will be described.

A transistor whose channel formation region is formed in an oxide semiconductor layer including In, Sn, and Zn as main components can have favorable characteristics by forming an oxide semiconductor film which is not processed into the oxide semiconductor layer while heating a substrate or by performing a heat treatment after the oxide semiconductor film is formed. Note that a main component refers to an element included in a composition at 5 atomic % or more. Note that the substrate corresponds to the semiconductor substrate 700.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 14A:
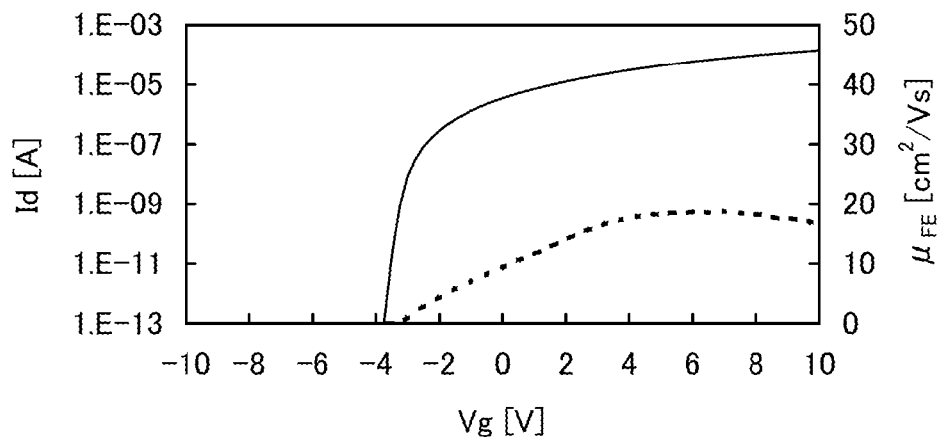
FIGS. 14A to 14C are graphs showing electric characteristics of a transistor including an oxide semiconductor.
Figure 14B:
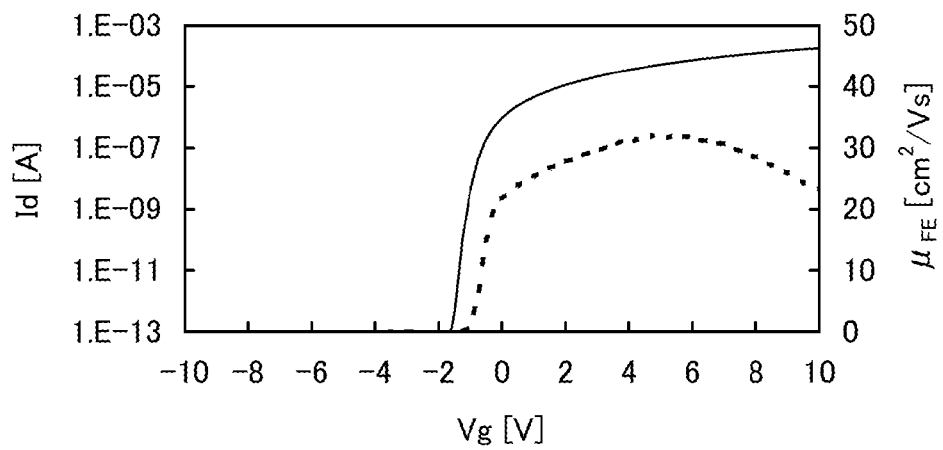
Figure 14C:
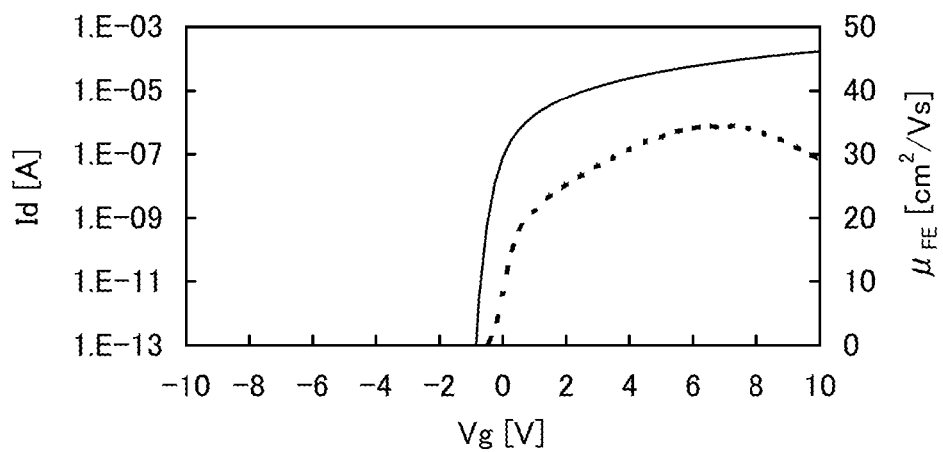

As an example, FIGS. 14A to 14C each show characteristics of a transistor that includes an oxide semiconductor layer including In, Sn, and Zn as main components and having a channel length L of 3 μm and a channel width W of 10 μm, and a gate insulating film with a thickness of 100 nm. Note that $V_d$ is set to 10 V.

FIG. 14A shows characteristics of a transistor whose oxide semiconductor film including In, Sn, and Zn as main components was formed by sputtering without heating a substrate intentionally. The field-effect mobility of the transistor is 18.8 cm²/Vs. On the other hand, when the oxide semiconductor film including In, Sn, and Zn as main components is formed while heating the substrate intentionally, the field-effect mobility can be improved. FIG. 14B shows characteristics of a transistor whose oxide semiconductor film including In, Sn, and Zn as main components was formed while heating a substrate at 200° C. The field-effect mobility of the transistor is 32.2 cm²/Vs.

The field-effect mobility can be further improved by performing heat treatment after the oxide semiconductor film including In, Sn, and Zn as main components is formed. FIG. 14C shows characteristics of a transistor whose oxide semiconductor film including In, Sn, and Zn as main components was formed by sputtering at 200° C. and then subjected to heat treatment at 650° C. The field-effect mobility of the transistor is 34.5 cm²/Vs.

The intentional heating of the substrate can reduce moisture taken into the oxide semiconductor film during the formation by sputtering. Further, the heat treatment after formation enables hydrogen, a hydroxyl group, or moisture to be released and removed from the oxide semiconductor film. In this manner, the field-effect mobility can be improved. It is presumed that such an improvement in field-effect mobility is achieved not only by removal of impurities by dehydration or dehydrogenation but also by a reduction in interatomic distance due to an increase in density. In addition, the oxide semiconductor can be crystallized by being purified by removal of impurities from the oxide semiconductor. In the case of using such a purified non-single-crystal oxide semiconductor, ideally, a field-effect mobility exceeding 100 cm²/Vs is expected to be achieved.

The oxide semiconductor film including In, Sn, and Zn as main components may be crystallized in the following manner: oxygen ions are implanted into the oxide semiconductor film; hydrogen, a hydroxyl group, or moisture included in the oxide semiconductor film is released by heat treatment; and the oxide semiconductor film is crystallized through the heat treatment or by another heat treatment performed later. By such crystallization treatment or recrystallization treatment, a non-single-crystal oxide semiconductor having favorable crystallinity can be obtained.

The intentional heating of the substrate during formation and/or the heat treatment after the formation contributes not only to improving field-effect mobility but also to making the transistor normally off. In a transistor in which an oxide semiconductor film that includes In, Sn, and Zn as main components and that is formed without heating a substrate intentionally is used as a channel formation region, the threshold voltage tends to be shifted negatively. In contrast, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 14A and 14B.

Note that the threshold voltage can also be controlled by changing the ratio of In, Sn, and Zn; when the composition ratio of In, Sn, and Zn is 2:1:3, a normally-off transistor can be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is higher than or equal to 150° C., preferably higher than or equal to 200° C., further preferably higher than or equal to 400° C. When formation or heat treatment is performed at a high temperature, the transistor can be normally off.

By intentionally heating the substrate during formation and/or by performing heat treatment after the formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film; and Sample 2 on which heat treatment at 650° C. is performed after deposition of an oxide semiconductor film.

First, $V_g$-$I_d$ characteristics of the transistors were measured at a substrate temperature of 25° C. and $V_d$ (a potential difference between the source and the drain) of 10V. Then, the substrate temperature is set to 150° C. and $V_d$ was set to 0.1 V. After that, $V_g$ of 20 V was applied so that the intensity of an electric field applied to the gate insulating film 608 is 2 MV/cm, and the condition is kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors are measured at a substrate temperature of 25° C. and $V_d$ of 10 V. Then, the substrate temperature is set to 150° C. and $V_d$ was set to 0.1 V. After that, $V_g$ of −20 V is applied so that the intensity of an electric field applied to the gate insulating film 608 is −2 MV/cm, and the condition is kept for one hour. Next, $V_g$ was set to 0 V. Then, $V_g$-$I_d$ characteristics of the transistors are measured at a substrate temperature of 25° C. and $V_d$ of 10 V. This process is called a negative BT test.

Figure 15A:
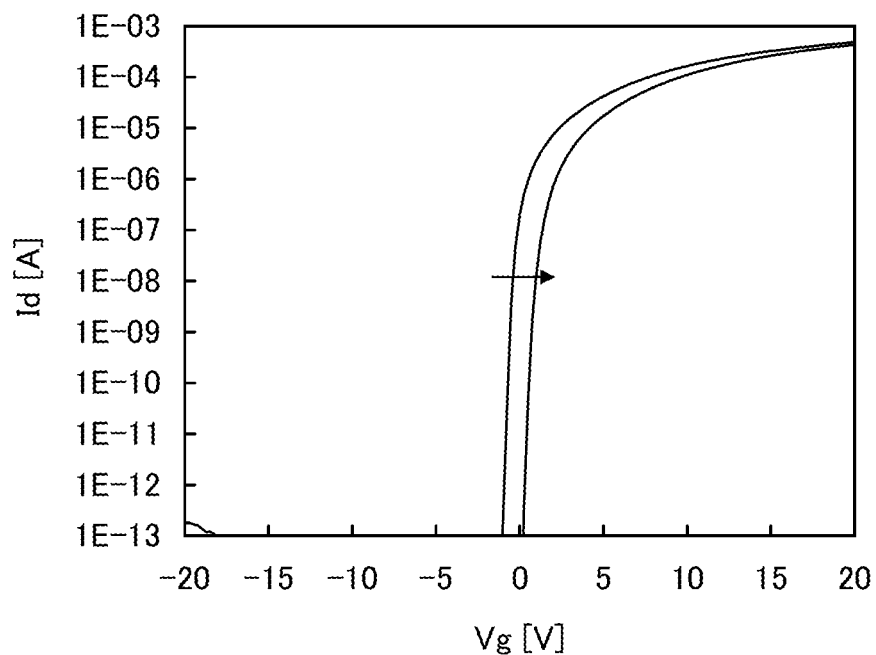
FIGS. 15A and 15B are graphs showing $V_g$-$I_d$ characteristics after a BT test of a transistor of Sample 1.
Figure 15B:
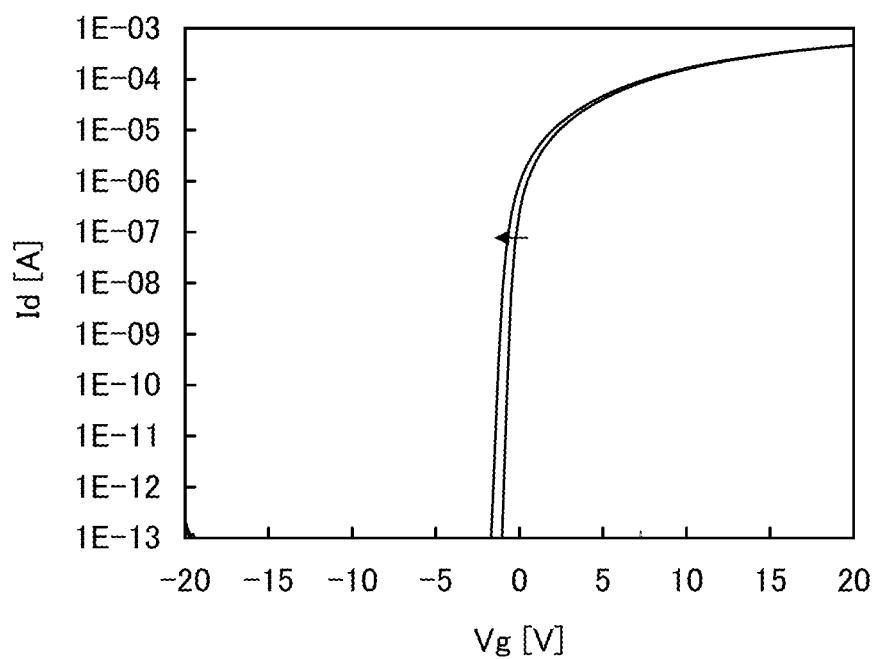
Figure 16A:
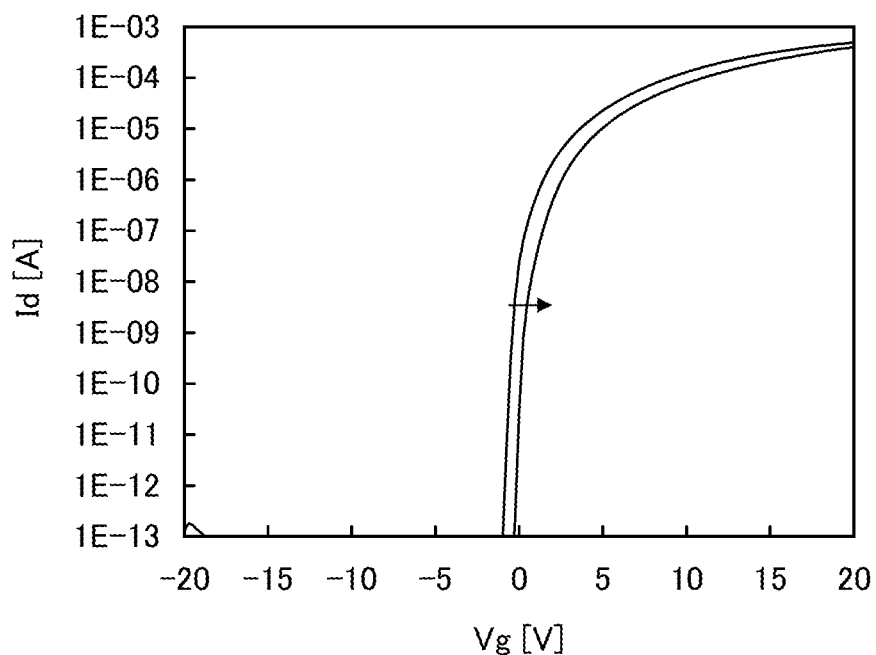
FIGS. 16A and 16B are graphs showing $V_g$-$I_d$ characteristics after a BT test of a transistor of Sample 2.
Figure 16B:
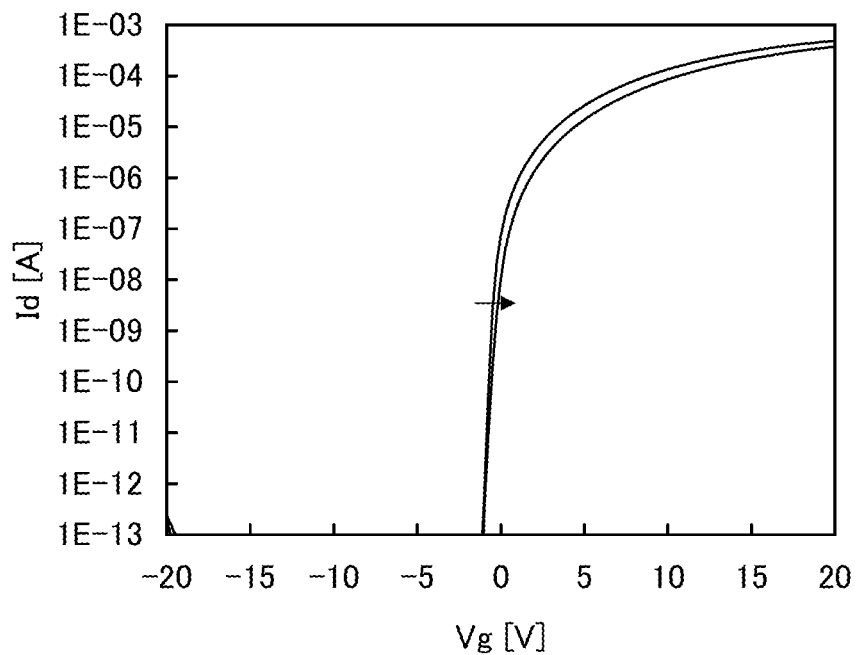

FIGS. 15A and 15B show results of the positive BT test and the negative BT test, respectively, of Sample 1. FIGS. 16A and 16B show results of the positive BT test and the negative BT test, respectively, of Sample 2.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor film after dehydration or dehydrogenation, whereby the advantageous effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen vacancy is easily caused in the oxide semiconductor film or at an interface between the oxide semiconductor film and a film stacked therewith; when excess oxygen is included in the oxide semiconductor film by the heat treatment, oxygen vacancy caused later can be compensated for with excess oxygen. The excess oxygen is mainly oxygen existing between lattices. When the concentration of oxygen is set in the range of $1 \times 10^{16}$/cm³ to $2 \times 10^{20}$/cm³, excess oxygen can be included in the oxide semiconductor film without causing crystal distortion or the like.

When heat treatment is performed so that at least part of the oxide semiconductor includes crystal, a more stable oxide semiconductor film can be obtained. For example, when an oxide semiconductor film that is formed by sputtering, using a target having a composition ratio of In:Sn:Zn=1:1:1, without heating a substrate intentionally is analyzed by X-ray diffraction (XRD), a halo pattern is observed. This formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film is conducted. The XRD analysis is conducted using an X-ray diffractometer D8 ADVANCE manufactured by Bruker AXS, and measurement is performed by an out-of-plane method.

Sample A and Sample B are prepared and the XRD analysis is performed thereon. A method for forming Sample A and Sample B will be described below.

An In—Sn—Zn—O film with a thickness of 100 nm is formed over a quartz substrate that has been subjected to dehydrogenation treatment.

The In—Sn—Zn—O film is formed with a sputtering apparatus with a power of 100 W (DC) in an oxygen atmosphere. An In—Sn—Zn—O target of In:Sn:Zn=1:1:1 [atomic ratio] is used as a target. Note that the substrate heating temperature during deposition is set at 200° C. A sample formed in this manner is used as Sample A.

Next, a sample formed by a method similar to that of Sample A is subjected to heat treatment at 650° C. As the heat treatment, heat treatment in a nitrogen atmosphere is first performed for one hour and heat treatment in an oxygen atmosphere is further performed for one hour without lowering the temperature. A sample formed in this manner is used as Sample B.

Figure 19:
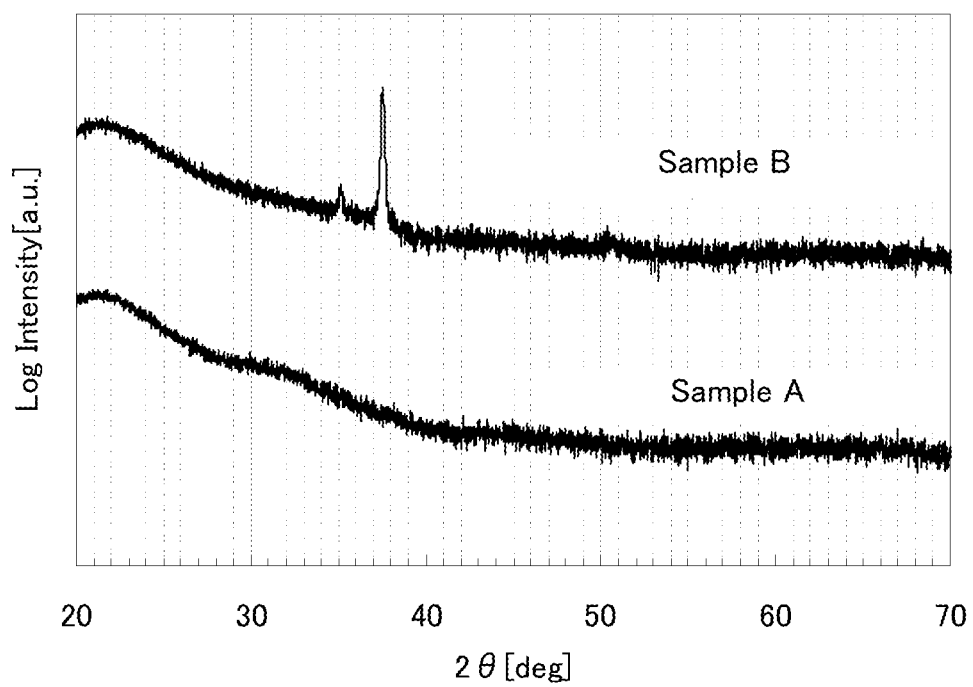
FIG. 19 shows XRD spectra of Sample A and Sample B.

FIG. 19 shows XRD spectra of Sample A and Sample B. No peak derived from crystal is observed in Sample A, whereas peaks derived from crystal are observed when 2θ is around 35 deg. and at 37 deg. to 38 deg. in Sample B.

As described above, by intentionally heating a substrate during formation of an oxide semiconductor including In, Sn, and Zn as main components and/or by performing heat treatment after the formation, characteristics of a transistor can be improved.

These substrate heating and heat treatment have an advantageous effect of preventing hydrogen and a hydroxyl group, which are unfavorable impurities for an oxide semiconductor, from being included in the film or an advantageous effect of removing hydrogen and a hydroxyl group from the film. That is, an oxide semiconductor can be purified by removing hydrogen serving as a donor impurity from the oxide semiconductor, whereby a normally-off transistor can be obtained. The high purification of an oxide semiconductor enables the off-state current of the transistor to be 1 aA or lower. Here, the unit of the off-state current represents current per micrometer of a channel width.

Figure 22:
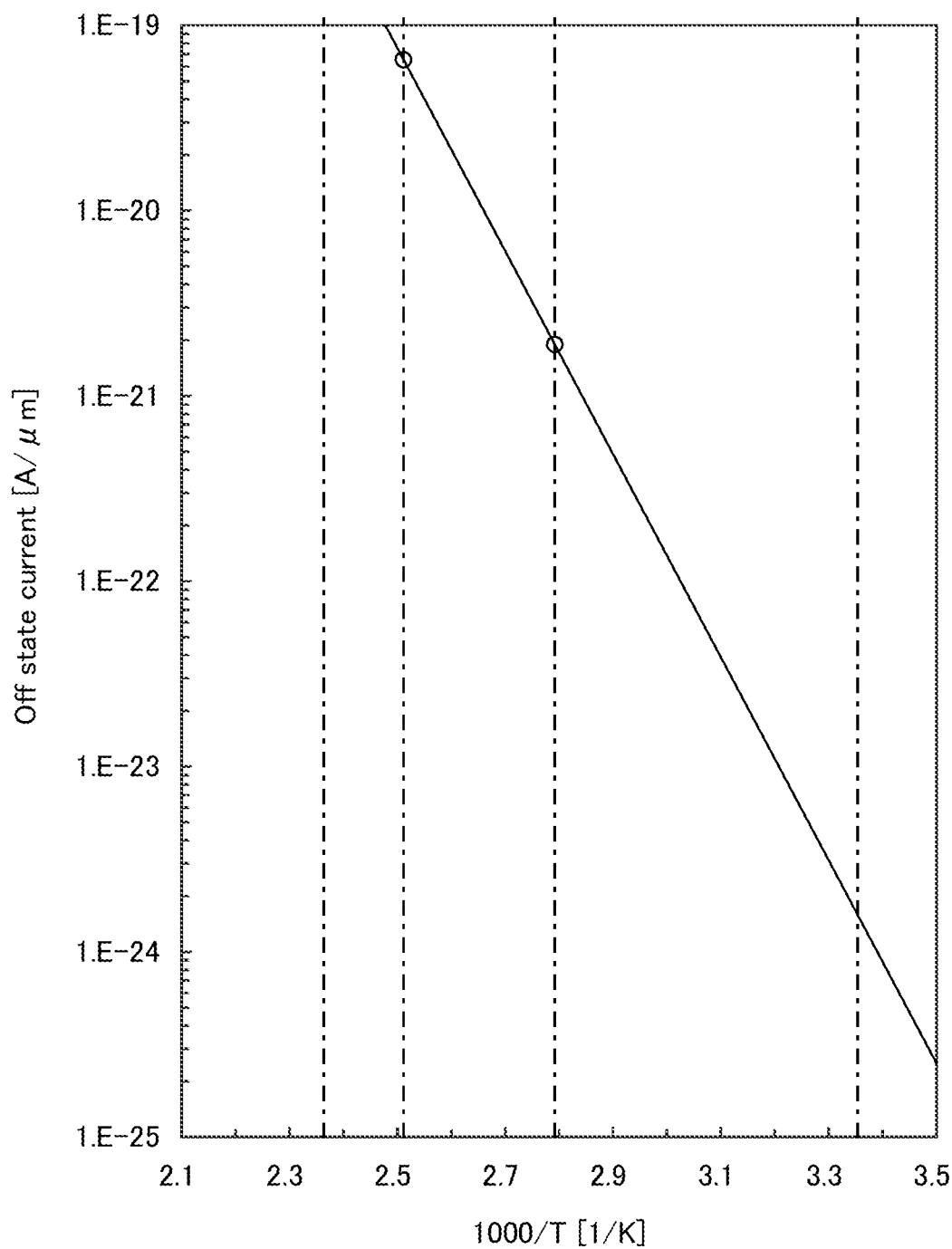
FIG. 22 is a graph showing an off-state current and substrate temperature dependence in measurement of a transistor including an oxide semiconductor.

FIG. 22 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 22, the off-state current can be lower than or equal to 1 aA/μm ($1\times10^{-18}$ A/μm), lower than or equal to 100 zA/μm ($1\times10^{-19}$ A/μm), and lower than or equal to 1 zA/μm ($1\times10^{-21}$ A/μm) when the substrate temperature is 125° C., 85° C., and room temperature (27° C.), respectively. Preferably, the off-state current can be lower than or equal to 0.1 aA/μm ($1\times10^{-19}$ A/μm), lower than or equal to 10 zA/μm ($1\times10^{-29}$ A/μm), and lower than or equal to 0.1 zA/μm ($1\times10^{-22}$ A/μm) at 125° C., 85° C., and room temperature, respectively.

Note that in order to prevent hydrogen and moisture from being included in the oxide semiconductor film during formation of the film, it is preferable to increase the purity of a sputtering gas by sufficiently suppressing leakage from the outside of a treatment chamber and degasification through an inner wall of the treatment chamber. For example, a gas with a dew point of lower than or equal to −70° C. is preferably used as the sputtering gas in order to prevent moisture from being included in the film. In addition, it is preferable to use a target that is highly purified so as not to include impurities such as hydrogen and moisture. Although it is possible to remove moisture from a film of an oxide semiconductor including In, Sn, and Zn as main components by heat treatment, a film that does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of the transistor of the sample on which heat treatment at 650° C. was performed after formation of the oxide semiconductor film is evaluated.

The transistor used for the measurement has a channel length L of 3 μm, a channel width W of 10 μm, Lov of 0 μm, and dW of 0 μm. Note that $V_d$ is set to 10 V. Note that the substrate temperature is −40° C., −25° C., 25° C., 75° C., 125° C., and 150° C. Here, the width of a portion where a gate electrode overlaps with one of a pair of electrodes is referred to as Lov, and the width of a portion of the pair of electrodes, which does not overlap with an oxide semiconductor film, is referred to as dW.

Figure 17:
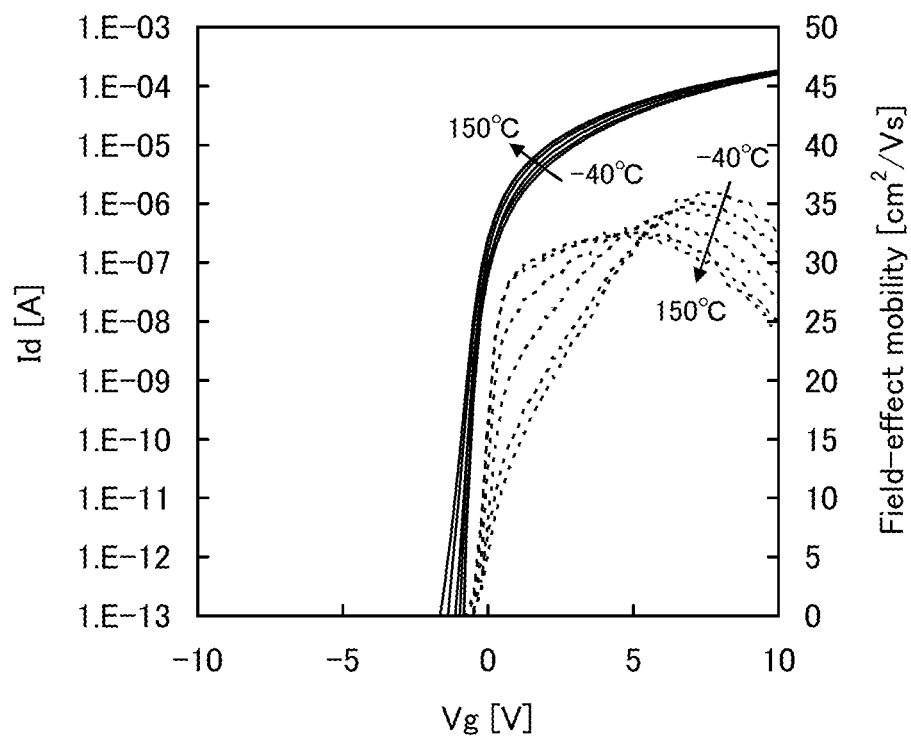
FIG. 17 shows the gate voltage dependence of drain current and field-effect mobility in a transistor including an oxide semiconductor.
Figure 18A:
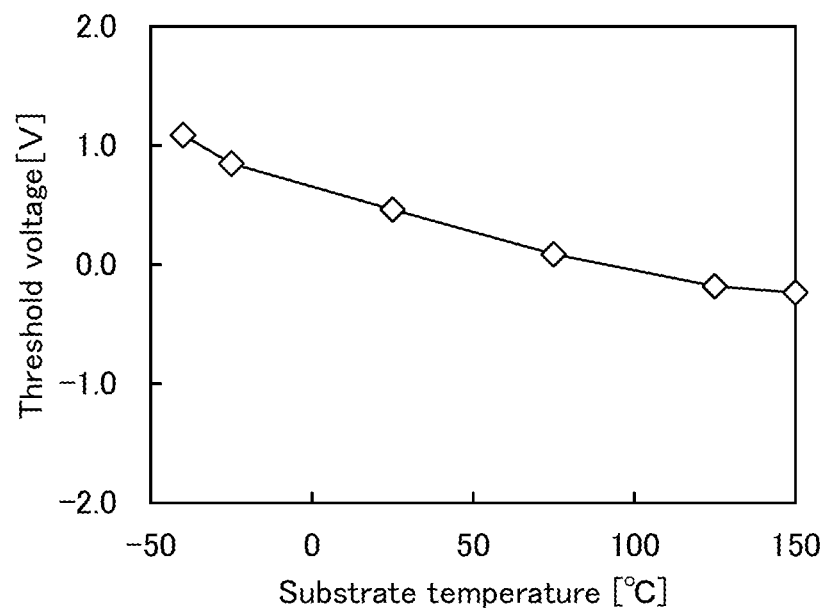
FIGS. 18A and 18B are graphs showing electric characteristics and substrate temperature dependence of a transistor including an oxide semiconductor.

FIG. 17 shows the $V_g$ dependence of $I_d$ (a solid line) and field-effect mobility (a dotted line). FIG. 18A shows a relation between the substrate temperature and the threshold voltage, and FIG. 18B shows a relation between the substrate temperature and the field-effect mobility.

From FIG. 18A, it is found that the threshold voltage gets lower as the substrate temperature increases. Note that the threshold voltage is decreased from 1.09 V to −0.23 V in the range from −40° C. to 150° C.

Figure 18B:
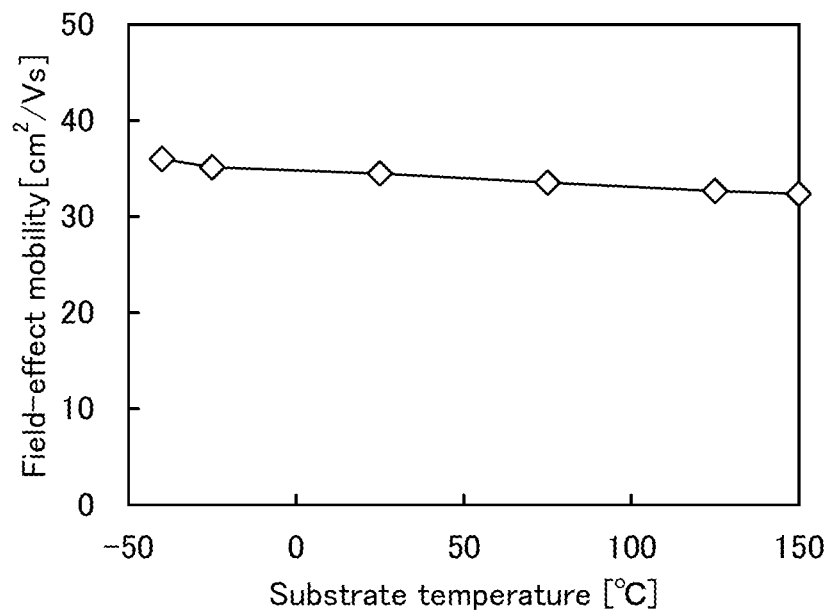

From FIG. 18B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used for a channel formation region, a field-effect mobility higher than or equal to 30 cm$^2$/Vs, preferably higher than or equal to 40 cm$^2$/Vs, further preferably higher than or equal to 60 cm$^2$/Vs can be obtained with the off-state current maintained at 1 aA/μm or lower, which can achieve on-state current needed for an LSI. For example, in an FET where L/W is 33 nm/40 nm, an on-state current higher than or equal to 12 μA can flow when the gate voltage is 2.7 V and the drain voltage is 1.0 V. In addition, sufficient electric characteristics can be ensured in a temperature range needed for the operation of a transistor. With such characteristics, an integrated circuit having a novel function can be achieved without decreasing the operation speed even when a transistor including an oxide semiconductor is provided in an integrated circuit formed using a Si semiconductor.

Note that the contents of this embodiment or part thereof can be combined freely with the contents of other embodiments or part thereof.

EXPLANATION OF REFERENCE

12: differential amplifier, 13: gain stage, 14: gain stage, 15: output stage, 16: first transistor, 18: second transistor, 20: third transistor, 22: fourth transistor, 100: voltage follower, 102: first transistor, 104: second transistor, 106: third transistor, 108: fourth transistor, 110: fifth transistor, 112: sixth transistor, 114: seventh transistor, 116: eighth transistor, 118: ninth transistor, 120: differential amplifier, 122: gain stage, 200: voltage follower, 202: first transistor, 204: second transistor, 206: third transistor, 208: fourth transistor, 210: fifth transistor, 212: sixth transistor, 214: capacitor, 216: seventh transistor, 218: eighth transistor, 220: ninth transistor, 222: tenth transistor, 224: eleventh transistor, 226: twelfth transistor, 228: thirteenth transistor, 230: differential amplifier, 232: gain stage, 234: output stage, 500: substrate, 502: base insulating film, 504: protective insulating film, 506a: high-resistance region, 506b: low-resistance region, 506: oxide semiconductor film, 508: gate insulating film, 510: gate electrode, 512: sidewall insulating film, 514: pair of electrodes, 516: interlayer insulating film, 518: wiring, 600: substrate, 602: base insulating film, 606: oxide semiconductor film, 608: gate insulating film, 610: gate electrode, 614: pair of electrodes, 616: interlayer insulating film, 618: wiring, 620: protective film, 700: semiconductor substrate, 701: high-concentration impurity region, 702: low-concentration impurity region, 703: gate insulating film, 704: gate electrode, 705: interlayer insulating film, 710: transistor, 711: oxide semiconductor layer, 712a: source electrode, 712b: drain electrode, 713: gate insulating film, 714: gate electrode, 1010: base insulator, 1020: embedded insulator, 1030a: semiconductor region, 1030b: semiconductor region, 1030c: semiconductor region, 1040: gate insulator, 1050: gate electrode, 1060a: sidewall insulator, 1060b: sidewall insulator, 1070: insulator, 1080a: source electrode, and 1080b: drain electrode.

This application is based on Japanese Patent Application serial No. 2011-108736 filed with the Japan Patent Office on May 13, 2011, the entire contents of which are hereby incorporated by reference.

The invention claimed is:

1. A semiconductor device comprising:
a first input terminal to which an input potential is input;
a second input terminal to which a reference potential is input;
a first output terminal from which an output potential is output;
a differential amplifier electrically connected to the first input terminal and the second input terminal; and
a gain stage comprising a first transistor, a second transistor, a third transistor, and a fourth transistor, and electrically connected to the first output terminal;
wherein the differential amplifier is electrically connected to a first power supply potential line and a second power supply potential line,
wherein a potential of the first power supply potential line is higher than that of the second power supply potential line,
wherein a first terminal of the first transistor is electrically connected to a second output terminal of the differential amplifier,
wherein a second terminal of the first transistor is electrically connected to a gate of the third transistor,
wherein a first terminal of the second transistor is electrically connected to the second input terminal,
wherein a second terminal of the second transistor is electrically connected to a gate of the fourth transistor,
wherein a first terminal of the third transistor is electrically connected to the first power supply potential line,
wherein a second terminal of the third transistor and a first terminal of the fourth transistor are electrically connected to the first output terminal,
wherein a second terminal of the fourth transistor is electrically connected to the second power supply potential line, and
wherein the first transistor and the second transistor are each a transistor whose leakage current in an off state per micrometer of a channel width is lower than or equal to $1 \times 10^{-17}$ A.

2. A semiconductor device comprising:
a first input terminal to which an input potential is input;
a second input terminal to which a reference potential is input;
a first output terminal from which an output potential is output;
a differential amplifier electrically connected to the first input terminal and the second input terminal;
an output stage comprising a first transistor, a second transistor, a third transistor, and a fourth transistor, and electrically connected to the first output terminal; and
a gain stage provided between the differential amplifier and the output stage and electrically connected to the differential amplifier and the output stage,
wherein the differential amplifier and the gain stage are electrically connected to a first power supply potential line and a second power supply potential line,
wherein a potential of the first power supply potential line is higher than that of the second power supply potential line,
wherein a first terminal of the first transistor is electrically connected to a second output terminal of the gain stage,
wherein a second terminal of the first transistor is electrically connected to a gate of the third transistor,
wherein a first terminal of the second transistor is electrically connected a third output terminal of the gain stage,
wherein a second terminal of the second transistor is electrically connected to a gate of the fourth transistor,
wherein a first terminal of the third transistor is electrically connected to the first power supply potential line,
wherein a second terminal of the third transistor and a first terminal of the fourth transistor are electrically connected to the first output terminal,
wherein a second terminal of the fourth transistor is electrically connected to the second power supply potential line,
wherein the first transistor and the second transistor are each a transistor whose leakage current in an off state per micrometer of a channel width is lower than or equal to $1 \times 10^{-17}$ A, and
wherein the same potential is supplied to gates of the first transistor and the second transistor.

3. The semiconductor device according to claim 1, wherein the first transistor and the second transistor each include an oxide semiconductor layer and a channel formation region included in the oxide semiconductor layer.

4. The semiconductor device according to claim 2, wherein the first transistor and the second transistor each include an oxide semiconductor layer and a channel formation region included in the oxide semiconductor layer.

5. A semiconductor device comprising:
a first transistor;
a second transistor;
a third transistor;
a fourth transistor;
a fifth transistor;
a sixth transistor;
a seventh transistor;
an eighth transistor; and
a ninth transistor,
wherein a first terminal of the first transistor and a first terminal of the second transistor are electrically connected to a first power supply potential line,
wherein a second terminal of the first transistor is electrically connected to a gate of the first transistor, a gate of the second transistor, and a first terminal of the third transistor,
wherein a second terminal of the second transistor is electrically connected to a first terminal of the fourth transistor,
wherein a second terminal of the third transistor and a second terminal of the fourth transistor are electrically connected to a first terminal of the fifth transistor,
wherein a second terminal of the fifth transistor is electrically connected to a second power supply potential line,
wherein a potential of the first power supply potential line is higher than that of the second power supply potential line,
wherein a first terminal of the sixth transistor is electrically connected to the first power supply potential line,
wherein a first terminal of the seventh transistor is electrically connected to the second terminal of the second transistor and the first terminal of the fourth transistor,
wherein a second terminal of the seventh transistor is electrically connected to a gate of the sixth transistor,
wherein a first terminal of the eighth transistor is electrically connected to a gate of the fifth transistor,
wherein a second terminal of the eighth transistor is electrically connected to a gate of the ninth transistor,
wherein a first terminal of the ninth transistor is electrically connected to the second terminal of the fifth transistor and the second power supply potential line,
wherein a gate of the fourth transistor is electrically connected to a first input terminal to which an input potential is input,
wherein a gate of the third transistor, a second terminal of the sixth transistor, and a second terminal of the ninth transistor are electrically connected to an output terminal,
wherein the gate of the fifth transistor is electrically connected to a second input terminal to which a reference potential is input,
wherein the first transistor, the second transistor, and the sixth transistor are p-channel transistors,
wherein the third transistor, the fourth transistor, the fifth transistor, and the ninth transistor are n-channel transistors, and
wherein the seventh transistor and the eighth transistor are each a transistor whose leakage current in an off state per micrometer of a channel width is lower than or equal to $1\times10^{-17}$ A.

6. The semiconductor device according to claim 5, wherein the seventh transistor and the eighth transistor each include an oxide semiconductor layer and a channel formation region included in the oxide semiconductor layer.

7. A semiconductor device comprising:
a first transistor;
a second transistor;
a third transistor;
a fourth transistor;
a fifth transistor;
a sixth transistor;
a seventh transistor;
an eighth transistor;
a ninth transistor;
a tenth transistor;
an eleventh transistor;
a twelfth transistor;
a thirteenth transistor; and
a capacitor,
wherein a first terminal of the first transistor and a first terminal of the second transistor are electrically connected to a first power supply potential line,
wherein a second terminal of the first transistor is electrically connected to a gate of the first transistor, a gate of the second transistor, and a first terminal of the third transistor,
wherein a second terminal of the second transistor is electrically connected to a first terminal of the fourth transistor,
wherein a second terminal of the third transistor and a second terminal of the fourth transistor are electrically connected to a first terminal of the fifth transistor,
wherein a second terminal of the fifth transistor is electrically connected to a second power supply potential line,
wherein a potential of the first power supply potential line is higher than that of the second power supply potential line,
wherein a first terminal of the sixth transistor is electrically connected to the first power supply potential line,
wherein the second terminal of the second transistor and the first terminal of the fourth transistor are electrically connected to a gate of the sixth transistor and one electrode of the capacitor,
wherein a second terminal of the sixth transistor and the other electrode of the capacitor are electrically connected to a first terminal of the seventh transistor and a gate of the seventh transistor,
wherein a second terminal of the seventh transistor is electrically connected to a first terminal of the eighth transistor,
wherein a second terminal of the eighth transistor is electrically connected to a gate of the eighth transistor and a first terminal of the ninth transistor,
wherein a second terminal of the ninth transistor is electrically connected to the second power supply potential line,
wherein a first terminal of the tenth transistor is electrically connected to the first power supply potential line,
wherein a first terminal of the eleventh transistor is electrically connected to the gate of the seventh transistor,
wherein a gate of the tenth transistor is electrically connected to a second terminal of the eleventh transistor, wherein a first terminal of the twelfth transistor is electrically connected to the gate of the eighth transistor, wherein a second terminal of the twelfth transistor is electrically connected to a gate of the thirteenth transistor, wherein a second terminal of the tenth transistor is electrically connected to a first terminal of the thirteenth transistor, wherein a second terminal of the thirteenth transistor is electrically connected to the second power supply potential line, wherein a gate of the fourth transistor is electrically connected to a first input terminal to which an input potential is input, wherein a gate of the third transistor, the second terminal of the tenth transistor, and the first terminal of the thirteenth transistor are electrically connected to an output terminal from which an output potential is output, wherein a gate of the fifth transistor and a gate of the ninth transistor are electrically connected to a second input terminal to which a reference potential is input, wherein the first transistor, the second transistor, the sixth transistor, the eighth transistor, and the thirteenth transistor are p-channel transistors, wherein the third transistor, the fourth transistor, the fifth transistor, the seventh transistor, the ninth transistor, and the tenth transistor are n-channel transistors, and wherein the eleventh transistor and the twelfth transistor are each a transistor whose leakage current in an off state per micrometer of a channel width is lower than or equal to $1 \times 10^{-17}$ A.

8. The semiconductor device according to claim 7, wherein the eleventh transistor and the twelfth transistor each include an oxide semiconductor layer and a channel formation region included in the oxide semiconductor layer.

9. The semiconductor device according to claim 1, wherein the same potential is supplied to gates of the first transistor and the second transistor.

10. The semiconductor device according to claim 1,
wherein a channel formation region of each of the first transistor and the second transistor include an oxide semiconductor layer, and
wherein a carrier concentration in the oxide semiconductor layer is lower than $1 \times 10^{14}/cm^3$.

11. The semiconductor device according to claim 1,
wherein a channel formation region of each of the first transistor and the second transistor include an oxide semiconductor layer, and
wherein an energy gap of the oxide semiconductor layer is higher than 2.5 eV.

12. The semiconductor device according to claim 2,
wherein a channel formation region of each of the first transistor and the second transistor include an oxide semiconductor layer, and
wherein a carrier concentration in the oxide semiconductor layer is lower than $1 \times 10^{14}/cm^3$.

13. The semiconductor device according to claim 2,
wherein a channel formation region of each of the first transistor and the second transistor include an oxide semiconductor layer, and
wherein an energy gap of the oxide semiconductor layer is higher than 2.5 eV.

14. The semiconductor device according to claim 5, wherein the same potential is supplied to gates of the seventh transistor and the eighth transistor.

15. The semiconductor device according to claim 5,
wherein a channel formation region of each of the seventh transistor and the eighth transistor include an oxide semiconductor layer, and
wherein a carrier concentration in the oxide semiconductor layer is lower than $1 \times 10^{14}/cm^3$.

16. The semiconductor device according to claim 5,
wherein a channel formation region of each of the first transistor and the second transistor include an oxide semiconductor layer, and
wherein an energy gap of the oxide semiconductor layer is higher than 2.5 eV.

17. The semiconductor device according to claim 7, wherein the same potential is supplied to gates of the eleventh transistor and the twelfth transistor.

18. The semiconductor device according to claim 7,
wherein a channel formation region of each of the eleventh transistor and the twelfth transistor include an oxide semiconductor layer, and
wherein a carrier concentration in the oxide semiconductor layer is lower than $1 \times 10^{14}/cm^3$.

19. The semiconductor device according to claim 7,
wherein a channel formation region of each of the eleventh transistor and the twelfth transistor include an oxide semiconductor layer, and
wherein an energy gap of the oxide semiconductor layer is higher than 2.5 eV.

* * * * *

UNITED STATES PATENT AND TRADEMARK OFFICE
CERTIFICATE OF CORRECTION

PATENT NO. : 8,736,371 B2  Page 1 of 1
APPLICATION NO. : 13/468117
DATED : May 27, 2014
INVENTOR(S) : Tatsuya Ohnuki It is certified that error appears in the above-identified patent and that said Letters Patent is hereby corrected as shown below:

IN THE SPECIFICATION:

Column 1, line 53, after "are" delete "bias,";

Column 4, line 49, after "terminal" insert --.--;

Column 7, line 10, before "$V_{osg}$)" insert --(--;

Column 9, line 48, after "stages" insert --:--;

Column 21, line 52, replace "$(ZnO)_n$" with --$(ZnO)_m$--;

Column 22, lines 18-19, after "(A + B + C = 1)"" delete ",";

Column 25, line 10, after "lower half" insert --.--;

Column 25, line 14, after "lower half" insert --.--;

Column 39, line 38, after "when" replace "2θ" with --2θ--; and

Column 40, line 3, replace "($1 \times 10^{-29}$"" with --($1 \times 10^{-20}$--.

Signed and Sealed this
Thirteenth Day of January, 2015

Michelle K. Lee
*Deputy Director of the United States Patent and Trademark Office*